(12) United States Patent
Shin et al.

(10) Patent No.: US 11,777,001 B2
(45) Date of Patent: *Oct. 3, 2023

(54) SEMICONDUCTOR DEVICE INCLUDING SUPERLATTICE PATTERN

(71) Applicant: SAMSUNG ELECTRONICS CO., LTD., Suwon-si (KR)

(72) Inventors: Ilgyou Shin, Seoul (KR); Minyi Kim, Hwaseong-si (KR); Myung Gil Kang, Suwon-si (KR); Jinbum Kim, Seoul (KR); Seung Hun Lee, Hwaseong-si (KR); Keun Hwi Cho, Seoul (KR)

(73) Assignee: Samsung Electronics Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 17/742,985

(22) Filed: May 12, 2022

(65) Prior Publication Data

US 2022/0278204 A1  Sep. 1, 2022

Related U.S. Application Data

(63) Continuation of application No. 17/088,011, filed on Nov. 3, 2020, now Pat. No. 11,362,182.

(30) Foreign Application Priority Data

Apr. 29, 2020  (KR) ........................ 10-2020-0052539

(51) Int. Cl.
*H01L 29/15* (2006.01)
*H01L 29/78* (2006.01)
*H01L 29/417* (2006.01)
*H01L 29/10* (2006.01)

(52) U.S. Cl.
CPC ........ *H01L 29/158* (2013.01); *H01L 29/1033* (2013.01); *H01L 29/41791* (2013.01); *H01L 29/785* (2013.01)

(58) Field of Classification Search
CPC ........... H01L 29/41791; H01L 29/1033; H01L 29/158; H01L 29/785; H01L 29/152
See application file for complete search history.

(56) References Cited

U.S. PATENT DOCUMENTS

| | | | |
|---|---|---|---|
| 7,700,447 B2 | 4/2010 | Dukovski et al. |
| 9,406,753 B2 | 8/2016 | Mears et al. |
| 9,899,479 B2 | 2/2018 | Mears et al. |
| 10,084,045 B2 | 9/2018 | Mears et al. |

(Continued)

FOREIGN PATENT DOCUMENTS

| | | |
|---|---|---|
| JP | 05129635 A | 5/1993 |
| JP | 2014-135359 A | 7/2014 |

*Primary Examiner* — Changhyun Yi
(74) *Attorney, Agent, or Firm* — Fish & Richardson P.C.

(57) ABSTRACT

A semiconductor device includes; a substrate including a first region and a second region, a first active pattern extending upward from the first region, a first superlattice pattern on the first active pattern, a first active fin centrally disposed on the first active pattern, a first gate electrode disposed on the first active fin, and first source/drain patterns disposed on opposing sides of the first active fin and on the first active pattern. The first superlattice pattern includes at least one first semiconductor layer and at least one first blocker-containing layer, and the first blocker-containing layer includes at least one of oxygen, carbon, fluorine and nitrogen.

20 Claims, 31 Drawing Sheets

(56) References Cited

U.S. PATENT DOCUMENTS

| | | |
|---|---|---|
| 10,128,379 B2 | 11/2018 | Song et al. |
| 10,361,309 B2 | 7/2019 | Lee et al. |
| 10,453,757 B2 | 10/2019 | Cheng et al. |
| 11,362,182 B2 * | 6/2022 | Shin ................ H01L 21/823821 |
| 2015/0144877 A1 | 5/2015 | Mears et al. |
| 2020/0105872 A1 * | 4/2020 | Glass ................ H01L 21/26513 |

* cited by examiner

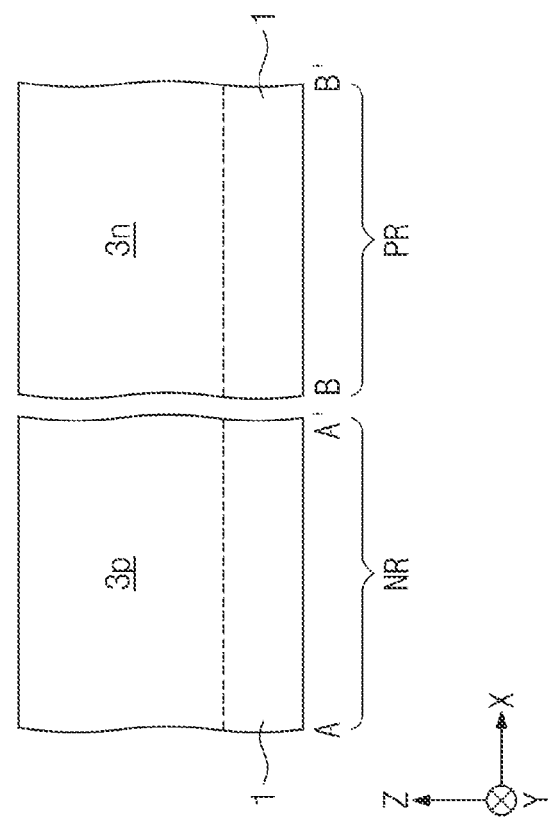

SEMICONDUCTOR DEVICE INCLUDING SUPERLATTICE PATTERN

CROSS-REFERENCE TO RELATED APPLICATION

This is a Continuation of U.S. application Ser. No. 17/088,011, filed Nov. 3, 2020, which issued as U.S. Pat. No. 11,362,182 on Jun. 14, 2022, and a claim priority under 35 U.S.C. § 119 is made to Korean Patent Application No. 10-2020-0052539 filed on Apr. 29, 2020 in the Korean Intellectual Property Office, the subject matter of which is hereby incorporated by reference.

BACKGROUND

Embodiments of the inventive concept relate generally to semiconductor devices.

Semiconductor devices are widely used in an electronic industry because of their small sizes, multi-functional characteristics, and/or low manufacturing costs. Semiconductor devices may be categorized as any one of semiconductor memory devices for storing logical data, semiconductor logic devices for processing logical data, and hybrid semiconductor devices having both the function of the semiconductor memory devices and the function of the semiconductor logic devices. Semiconductor devices with excellent characteristics have been increasingly demanded with the development of the electronic industry. For example, high-reliable, high-speed and/or multi-functional semiconductor devices have been increasingly demanded. To satisfy these demands, semiconductor devices have been highly integrated and structures in semiconductor devices have been more and more complicated.

SUMMARY

Embodiments of the inventive concept provide semiconductor devices including at least one superlattice pattern having improved reliability.

In one aspect, a semiconductor device according to the inventive concept includes; a substrate including a first region and a second region, a first active pattern extending upward from the first region, a first superlattice pattern on the first active pattern, a first active fin centrally disposed on the first active pattern, a first gate electrode disposed on the first active fin, and first source/drain patterns disposed on opposing sides of the first active fin and on the first active pattern. The first superlattice pattern includes at least one first semiconductor layer and at least one first blocker-containing layer, and the first blocker-containing layer includes at least one of oxygen, carbon, fluorine and nitrogen.

In another aspect, a semiconductor device according to the inventive concept includes; a substrate including a first region and a second region, a first active pattern extending upward from the first region, a first superlattice pattern on the first active pattern, a first active fin centrally disposed on the first active pattern, a first gate electrode disposed on the first active fin, and first source/drain patterns disposed on opposing sides of the first active fin in contact with the first superlattice pattern. The first superlattice pattern includes alternately stacked first semiconductor layers and first blocker-containing layers, the first blocker-containing layers include at least one of oxygen, carbon, fluorine and nitrogen, the first superlattice pattern is disposed between the first active pattern and the first active fin, the first superlattice pattern has a first thickness between the first active pattern and the first active fin and has a second thickness between the first source/drain pattern and the first active pattern, and the first thickness is greater than the second thickness.

In another aspect, a semiconductor device according to the inventive concept includes a substrate including a first region and a second region, a first superlattice region disposed on the first region, and a second superlattice region disposed on the second region, a first gate electrode disposed on the first region, first source/drain portion disposed on opposing sides of the first gate electrode, a second gate electrode disposed on the second region and second source/drain portion disposed on opposing sides of the second gate electrode. Each of the first and second superlattice regions includes blockers, the blockers include at least one of oxygen, carbon, fluorine and nitrogen, the first superlattice region has a first thickness under a center of a bottom surface of the first source/drain portion and has a second thickness under an edge of the bottom surface of the first source/drain portion, and the first thickness is different from the second thickness.

BRIEF DESCRIPTION OF THE DRAWINGS

The inventive concept may be understood upon consideration of the following detailed description together with the accompanying drawings.

FIGS. 4A, 5A, 6A, 7A, 8A, 9A and 10A (hereafter, collectively, "FIGS. 4A to 10A") are cross-sectional views illustrating a method of manufacturing a semiconductor device having cross sections like those shown in FIG. 2A.

DETAILED DESCRIPTION

Throughout the written description and drawings, like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

For clarity of illustration and description, a descriptive convention is assumed in which a first lateral (or horizontal) direction X is assumed to extend substantially in parallel with a principal surface of the substrate 1, a second lateral (or horizontal) direction Y is assumed to extend substantially in parallel with the principal surface of the substrate 1 and intersecting the first horizontal direction X, and a vertical direction Z is assumed to extend substantially orthogonal to the first horizontal direction X and the second horizontal direction Y.

Throughout the written description, the term "pattern" may be used to denote a region or a portion. For example, the term source/drain pattern may be referred to as a source/drain region or a source/drain portion, and the term superlattice pattern may be referred to as a superlattice region or a superlattice portion.

Figure 1:
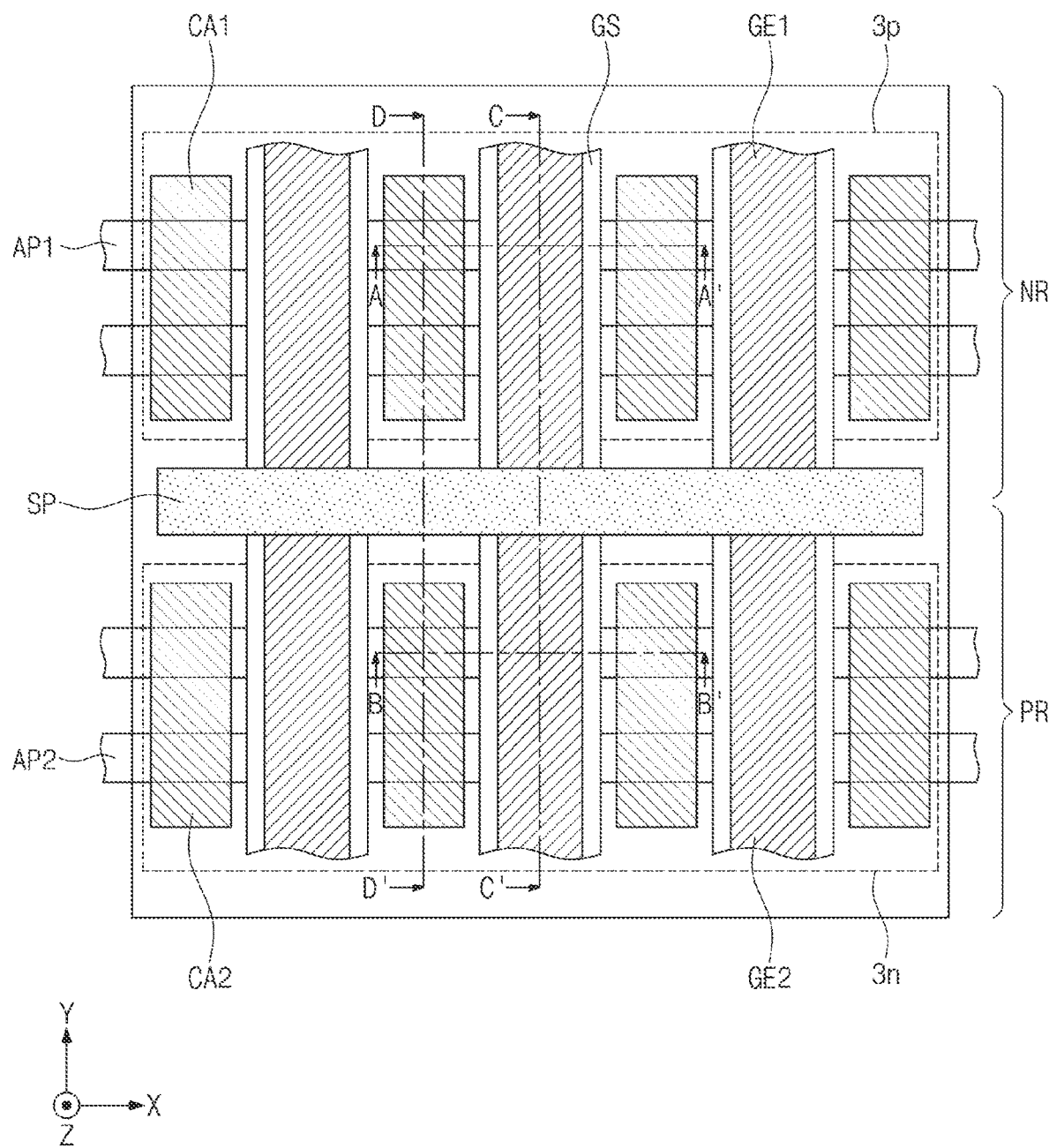
FIG. 1 is a plan view illustrating a semiconductor device according to embodiments of the inventive concept.
Figure 2A:
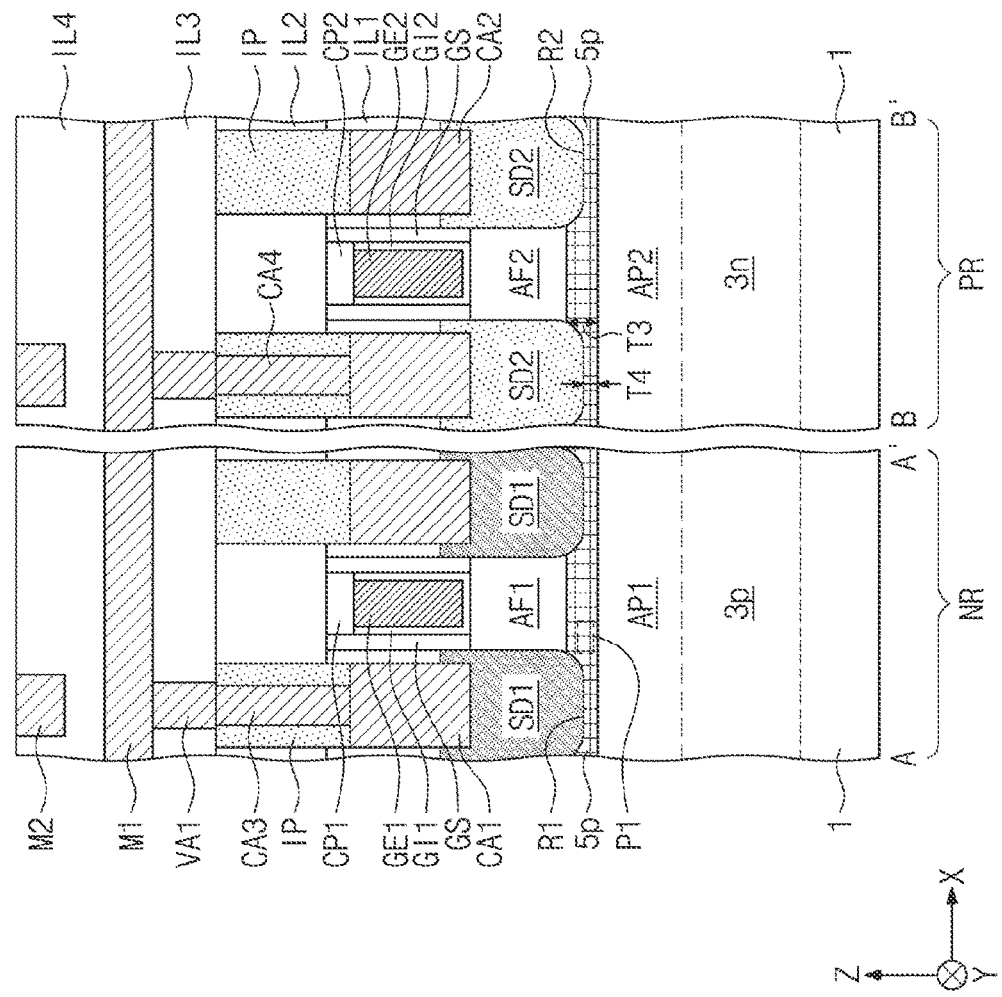
FIG. 2A is a cross-sectional view taken along lines A-A' and B-B' of FIG. 1.
Figure 2B:
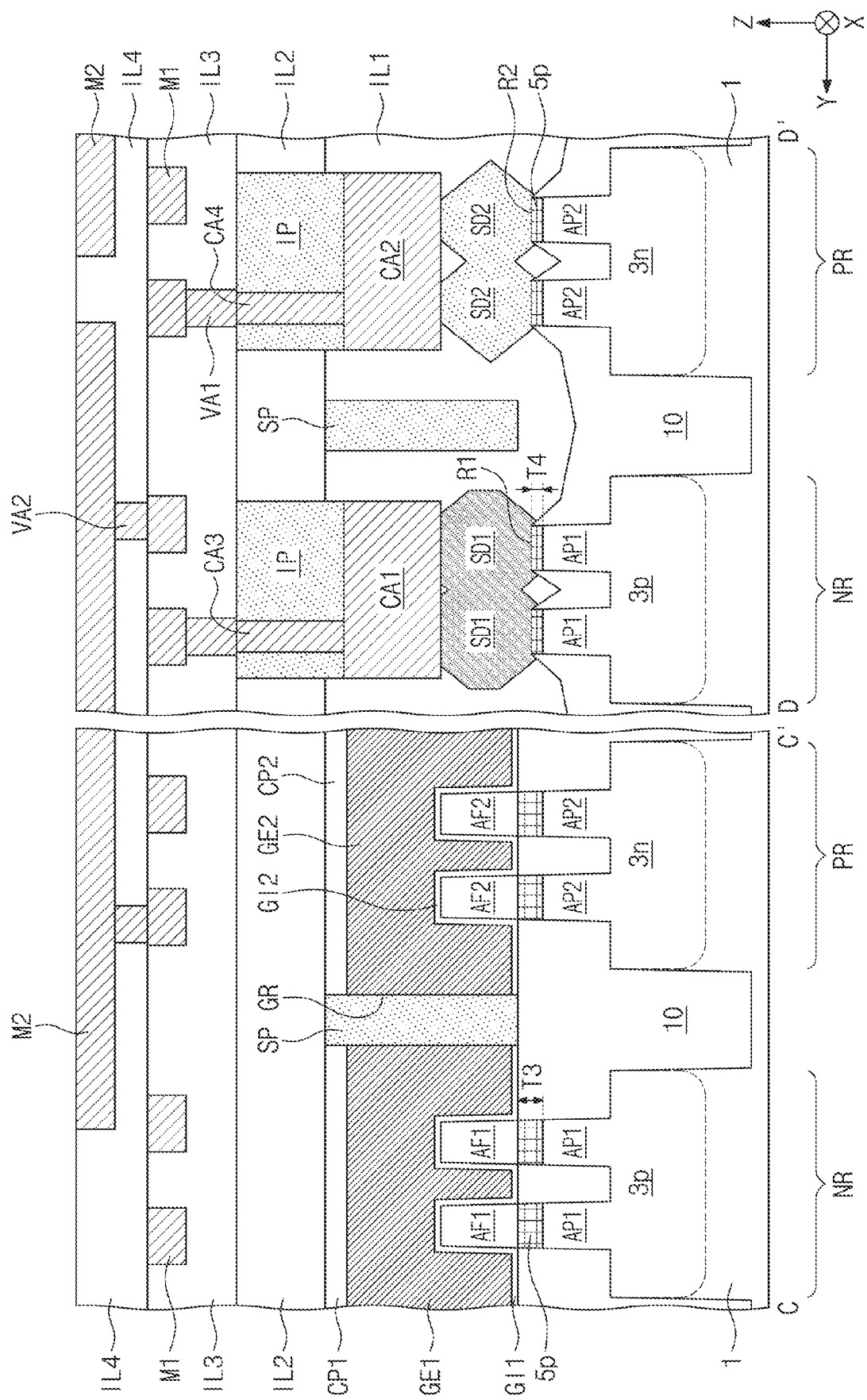
FIG. 2B is a cross-sectional view taken along lines C-C' and D-D' of FIG. 1.
Figure 3:
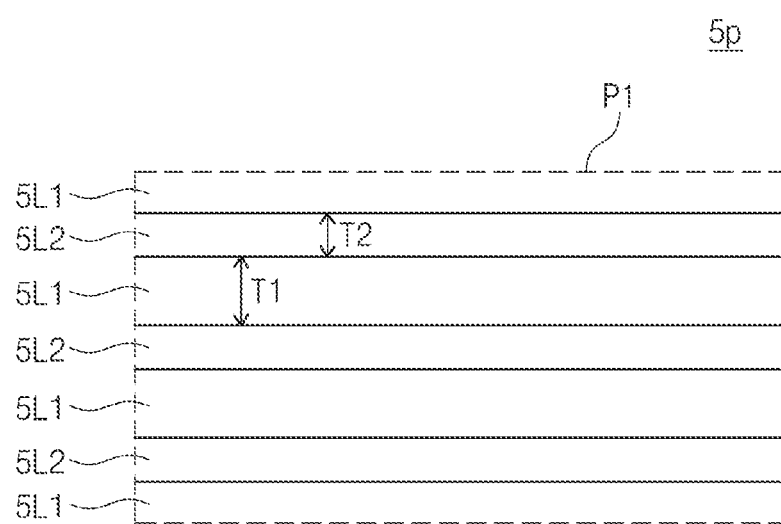
FIG. 3 is an enlarged view of portion 'P1' shown in FIG. 2A.

FIG. 1 is a plan view illustrating a semiconductor device according to embodiments of the inventive concept; FIG. 2A is a cross-sectional view taken along lines A-A' and B-B' of FIG. 1; FIG. 2B is a cross-sectional view taken along lines C-C' and D-D' of FIG. 1; and FIG. 3 is an enlarged view of portion 'P1' shown in FIG. 2A.

Referring collectively to FIGS. 1, 2A, 2B and 3, a substrate 1 may be a single-crystalline silicon wafer or a silicon-on-insulator (SOI) substrate. The substrate 1 may include a first region NR and a second region PR. Here, the first region NR may be a region in which an NMOS transistor is disposed, and the second region PR may be a region in which a PMOS transistor is disposed.

A first well region $3p$ may be formed in the first region NR, and a second well region $3n$ may be formed in the second region PR. For example, the first well region $3p$ may be formed by selectively doping a first portion of the substrate 1 with dopants of first conductivity type (e.g., P-type), and the second well region $3n$ may be formed by selectively doping a second portion of the substrate 1 with dopants of second conductivity type (e.g., N-type).

The first region NR including the first well region $3p$ and the second region PR including the second well region $3n$ may be electrically isolated using (e.g.,) a device insolation structure 10 formed in the substrate 1. The device isolation structure 10 may include a single-layer or multiple layers including at least one of a silicon oxide layer, a silicon nitride layer and/or a silicon oxynitride layer.

At least one first active pattern AP1 and at least one second active pattern AP2 may be formed to extend downward from a top surface of the substrate 1. Here, only two (2) first active patterns AP1 and two (2) second active patterns AP2 are shown as examples, but those skilled in the art will recognize that the number of first active patterns and second active patterns may vary with design. In the illustrated example of FIG. 1, each of the first active pattern AP1 and the second active patterns AP2 have a line (or bar) shape extending laterally in the first horizontal direction X, wherein the first active patterns AP1 and the second active patterns AP2 are spaced apart in the second horizontal direction Y.

Superlattice patterns $5p$ may be disposed on the first active patterns AP1 and the second active patterns AP2, respectively. In certain embodiments, the device isolation structure 10 may contact sidewalls of the first active patterns AP1, sidewalls of the second active patterns AP2 and/or sidewalls of the superlattice patterns $5p$.

Referring to FIGS. 2A and 3, the superlattice pattern $5p$ may include an alternating, vertical stack including at least one semiconductor layer 5L1 and at least one blocker-containing layer 5L2. A semiconductor layer 5L1 and an adjacent blocker-containing layer 5L2 may be understood as a "pair," and each of the superlattice patterns $5p$ may include between 1 to 10 pairs of the semiconductor layers 5L1 and the blocker-containing layers 5L2.

The semiconductor layers 5L1 may include semiconductor atoms. The blocker-containing layers 5L2 may include semiconductor atoms, as well as blockers. In this regard, the blocker-containing layers 5L2 may be understood as a semiconductor layer selectively doped with the blockers. Thus, in some embodiments, the semiconductor layers 5L1 may be silicon layers, and the blocker-containing layers 5L2 may be silicon layers doped with the blockers. The blockers inhibit or prevent diffusion (or movement) of the dopants used to form the first well region $3p$, the second well region $3n$ and/or source/drain patterns SD1 and SD2. The blockers may include at least one of oxygen, carbon, fluorine and nitrogen.

In certain embodiments, the blockers may particularly include oxygen, and the blocker-containing layers 5L2 may be oxygen-doped silicon layers.

A top surface of an uppermost blocker-containing layer 5L2 may be covered by an additional semiconductor layer 5L1. A bottom surface of a lowermost blocker-containing layer 5L2 may be covered by an additional semiconductor layer 5L1.

Each of the semiconductor layers 5L1 may independently have a first thickness T1, and each of the blocker-containing layers 5L2 may independently have a second thickness T2, wherein the first thickness T1 ranges between about 1 nm to 10 nm and the second thickness T2 ranges from between about 1 nm to 5 nm. In some embodiments, the respective thicknesses of the constituent semiconductor layers 5L1 may be equal may be different, and the respective thicknesses of the constituent blocker-containing layers 5L2 may be equal or may be different. For example, in certain embodiments each of the superlattice patterns $5p$ may include a first semiconductor layer 5L1 having a thickness of 10 nm, a first blocker-containing layer 5L2 having a thickness of 5 nm, a second semiconductor layer 5L1 having a thickness of 7 nm, a second blocker-containing layer 5L2 having a thickness of 3 nm, and a third semiconductor layer 5L1 having a thickness of 9 nm, wherein the semiconductor layers and the blocker-containing layers are sequentially stacked in the vertical direction Z relative to the substrate 1.

First active fins AF1 may be respectively disposed on the first active patterns AP1, and second active fins AF2 may be respectively disposed on the second active patterns AP2, wherein superlattice patterns $5p$ are disposed between first active patterns AP1 and first active fins AF1, as well as between second active patterns AP2 and second active fins AF2. Here, the first active fins AF1 and the second active fins AF2 may protrude (or vertically extend) upward from the device insolation structure 10.

A first gate electrode GE1 may be disposed on the first active fins AF1, wherein the first gate electrode GE1 covers top surfaces and sidewalls of the first active fins AF1 and extends in the second horizontal direction Y. A first gate insulating layer GI1 may be disposed between the first gate electrode GE1 and the first active fins AF1. A first gate capping pattern CP1 may be disposed on the first gate electrode GE1.

A second gate electrode GE2 may be disposed on the second active fins AF2, wherein the second gate electrode GE2 covers top surfaces and sidewalls of the second active fins AF2 and extends in the second horizontal direction Y. A second gate insulating layer GI2 may be disposed between the second gate electrode GE2 and the second active fins AF2. A second gate capping pattern CP2 may be disposed on the second gate electrode GE2.

The first and second gate electrodes GE1 and GE2 may include the same conductive material or may include different conductive materials. Each of the first and second gate electrodes GE1 and GE2 may include a work function pattern and a metal line pattern. The work function pattern may be an N-type work function pattern or a P-type work function pattern. The N-type work function pattern may include at least one of lanthanum (La), lanthanum oxide (LaO), tantalum (Ta), tantalum nitride (TaN), niobium (Nb), or titanium nitride (TiN). The P-type work function pattern may include at least one of aluminum (Al), aluminum oxide (AlO), titanium nitride (TiN), tungsten nitride (WN), or ruthenium oxide ($RuO_2$). The metal line pattern may include at least one of tungsten, copper, or aluminum. Each of the first and second gate electrodes GE1 and GE2 may further include a diffusion barrier pattern disposed between the work function pattern and the metal line pattern. The diffusion barrier pattern may include a metal nitride such as titanium nitride, tantalum nitride, or tungsten nitride.

Each of the first and second gate insulating layers GI1 and GI2 may include a silicon oxide layer. In some embodiments, each of the first and second gate insulating layers GI1 and GI2 may further include a high-k dielectric layer having a dielectric constant higher than a dielectric constant of the silicon oxide layer. For example, the high-k dielectric layer may be formed of at least one of hafnium oxide ($HfO_2$), hafnium silicate (HfSiO), hafnium oxynitride (HfON), hafnium silicon oxynitride (HfSiON), hafnium aluminum oxide ($HfAlO_3$), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), titanium oxide ($TiO_2$), barium strontium titanium oxide (BaSrTiO), barium titanium oxide (BaTiO), strontium titanium oxide (SrTiO), yttrium oxide (YO), aluminum oxide ($Al_2O_3$), tantalum oxide ($Ta_2O_3$), or lead scandium tantalum oxide (PbScTaO).

The first and second gate capping patterns CP1 and CP2 may be formed of, for example, silicon nitride. Sidewalls of the first and second gate electrodes GE1 and GE2 may be covered by gate spacers GS. Each of the gate spacers GS may independently include at least one of a silicon oxide layer, a silicon nitride layer, or a silicon oxynitride layer. In some embodiments, each of the first and second gate insulating layers GI1 and GI2 may extend between each of the first and second gate electrodes GE1 and GE2 and the gate spacers GS.

Referring to FIGS. 1 and 2B, a gate separation pattern SP may be disposed between the first and second gate electrodes GE1 and GE2 to separate the first gate electrode GE1 from the second gate electrode GE2. The gate separation pattern SP may include a single-layer or multiple layers including at least one of a silicon oxide layer, a silicon nitride layer, or a silicon oxynitride layer. The gate separation pattern SP may extend in the vertical direction Z and may thus be disposed between the first gate insulating layer GI1 and the second gate insulating layer GI2 and between the first gate capping pattern CP1 and the second gate capping pattern CP2. In addition, the gate separation pattern SP may extend in the first horizontal direction X and may be disposed in a first interlayer insulating layer IL1 provided on the substrate 1 (or the device insolation structure 10) between the first and second regions NR and PR.

First source/drain patterns SD1 may be disposed at opposing sides of the first gate electrode GE1. The first source/drain patterns SD1 may penetrate the first active fin AF1 to contact the superlattice pattern 5p. Each of the first source/drain patterns SD1 may include (e.g.,) a silicon epitaxial layer doped with phosphorus (P) or arsenic (As). Each of the first source/drain patterns SD1 may be disposed in a first recess region R1 formed in the first active fin AF1 and an upper portion of the superlattice pattern 5p.

Second source/drain patterns SD2 may be disposed at opposing sides of the second gate electrode GE2. The second source/drain patterns SD2 may penetrate the second active fin AF2 to contact the superlattice pattern 5p. Each of the second source/drain patterns SD2 may include (e.g.,) at least one silicon-germanium epitaxial layer doped with boron (B). For example, each of the second source/drain patterns SD2 may include stacked silicon-germanium epitaxial layers doped with boron (B), and germanium concentrations in the layers may be different from each other. Each of the second source/drain patterns SD2 may be disposed in a second recess region R2 formed in the second active fin AF2 and an upper portion of the superlattice pattern 5p. Referring to FIG. 2A, the superlattice pattern 5p may have a third thickness T3 at an edge of a bottom surface of each of the first and second source/drain patterns SD1 and SD2 and may have a fourth thickness T4 under a central portion of the bottom surface of each of the first and second source/drain patterns SD1 and SD2. Alternatively, referring to FIG. 2B, the superlattice pattern 5p may have a third thickness T3 between each of the active fins AF1 and AF2 and each of the active patterns AP1 and AP2 and may have a fourth thickness T4 between each of the source/drain patterns SD1 and SD2 and each of the active patterns AP1 and AP2. The fourth thickness T4 may be different from the third thickness T3. In certain embodiments, the fourth thickness T4 may be less than the third thickness T3.

The first gate electrode GE1, the first gate insulating layer GI1 and the first source/drain patterns SD1 on the first region NR may constitute a first transistor. For example, the first transistor may be an NMOS transistor. The second gate electrode GE2, the second gate insulating layer GI2 and the second source/drain patterns SD2 on the second region PR may constitute a second transistor. For example, the second transistor may be a PMOS transistor. Consistent with the exemplary illustrations of FIGS. 1, 2A, 2B and 3, the first and second transistors may be fin-type field effect transistors (FinFETs). Alternatively, the first and second transistors may be planar type FETs omitting the active fins structures AF1 and AF2.

The same superlattice patterns 5p may be disposed on the first region NR and the second region PR. Alternatively, in order to better optimize device performance, a first superlattice pattern 5p disposed on the first region NR may include a different material (e.g., a different or an additional blocker) than a second superlattice pattern 5p disposed on the second region PR.

Interstitials corresponding to lattice spaces may exist in crystal structures of semiconductor materials included in the substrate 1, the source/drain patterns SD1 and SD2 and the semiconductor layers 5L1 of the superlattice patterns 5p. Methods of manufacturing a semiconductor device may include processes performed at high temperatures. Dopants doped in the first well region 3p, dopants doped in the second well region 3n, and/or dopants doped in the various source/drain patterns SD1 and SD2 may undesirably diffuse (or migrate) under the influence of high temperature process(es). Thus, dopant concentrations of the first region 3p, the second well region 3n, and/or the source/drain patterns SD1 and SD2 may vary from specification (e.g., be lower than desired). Such variance in one or more dopant densities may reduce reliability of a semiconductor device.

When the dopants are diffused, the dopants may be moved through the interstitials. Accordingly, the superlattice patterns 5p may include the blocker-containing layers 5L2, such that the blockers may be located in interstitials provided in the blocker-containing layers 5L2. Thus, the blockers may impede (or block) undesired migration of dopants. That is, the superlattice patterns 5p may prevent movement of dopants between the first well region 3p, the second well region 3n and the source/drain patterns SD1 and SD2. More particularly, the superlattice patterns 5p may prevent dopants doped in the first well region 3p and dopants doped in the second well region 3n from migrating into one of the source/drain patterns SD1 and SD2. In addition, the superlattice patterns 5p may prevent the dopants doped in the source/drain patterns SD1 and SD2 from migrating into either of the first well region 3p or the second well region 3n. These outcomes improve the overall reliability of the semiconductor device.

The first and second source/drain patterns SD1 and SD2 may be covered by the first interlayer insulating layer IL1. Second to fourth interlayer insulating layers IL2, IL3 and IL4 may be sequentially stacked on the first interlayer insulating layer IL1 and the first and second gate capping patterns CP1 and CP2. Each of the first to fourth interlayer insulating layers IL1 to IL4 may include a single-layer or multiple layers including at least one of a silicon oxide layer, a silicon nitride layer, a silicon oxynitride layer, or a porous insulating layer.

First and second contact plugs CA1 and CA2 may be disposed in the first interlayer insulating layer IL1 and may be in contact with the first and second source/drain patterns SD1 and SD2, respectively. Contact capping patterns IP may be disposed on the first and second contact plugs CA1 and CA2, respectively. The contact capping patterns IP may penetrate the second interlayer insulating layer IL2 and a portion of the first interlayer insulating layer IL1 and may be in contact with the first and second contact plugs CA1 and CA2, respectively. The contact capping patterns IP may include an insulating material such as silicon oxide, silicon oxynitride, and/or silicon nitride. Third and fourth contact plugs CA3 and CA4 may penetrate the contact capping patterns IP to contact with the first and second contact plugs CA1 and CA2, respectively. The third and fourth contact plugs CA3 and CA4 may have widths in the first horizontal direction X or the second horizontal direction Y, which are less than widths of the first and second contact plugs CA1 and CA2 in the first horizontal direction X or the second horizontal direction Y. First via plugs VA1 and first interconnection lines M1 may be disposed in the third interlayer insulating layer IL3. Second via plugs VA2 and second interconnection lines M2 may be disposed in the fourth interlayer insulating layer IL4. The first to fourth contact plugs CA1 to CA4, the first and second via plugs VA1 and VA2 and the first and second interconnection lines M1 and M2 may include at least one metal, such as tungsten, copper and/or aluminum.

In FIGS. 2A and 2B, since the superlattice patterns 5p prevent diffusion of the dopants doped in the source/drain patterns SD1 and SD2, at least one of the first well region 3p and the second well region 3n may be omitted. In some embodiments, both of the first well region 3p and the second well region 3n may be omitted.

In the foregoing example, the substrate 1 has been described as including a number of active patterns (e.g., the first active pattern AP1 and the second active pattern AP2). Accordingly, the superlattice pattern 5p may be understood as being disposed in the substrate 1.

FIGS. 4A to 10A are cross-sectional views illustrating methods of manufacturing a semiconductor device having cross sections like those shown in FIG. 2A, and FIGS. 4B to 10B are cross-sectional views illustrating methods of manufacturing a semiconductor device having the cross sections like those shown in FIG. 2B.

Figure 4B:
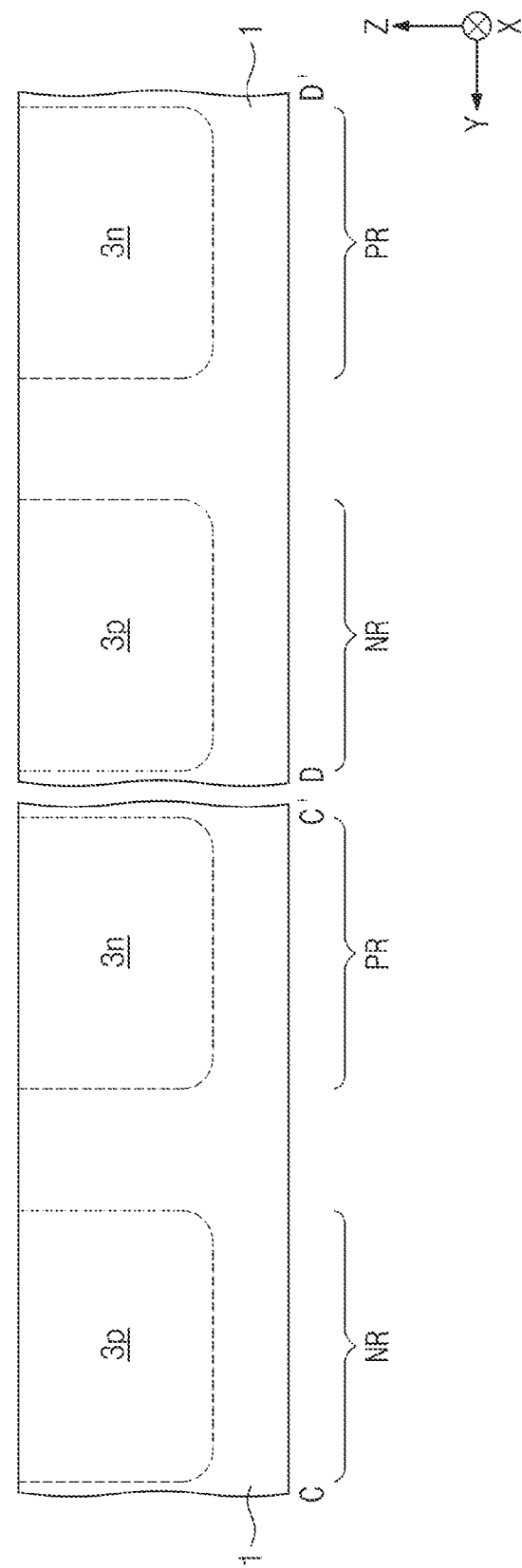
FIGS. 4B, 5B, 6B, 7B, 8B, 9B and 10B (hereafter, collectively, "FIGS. 4B to 10B") are cross-sectional views illustrating a method of manufacturing a semiconductor device having cross sections like those shown in FIG. 2B.

Referring to FIGS. 4A and 4B, ion implantation process(es) may be performed on a substrate 1 including the first region NR and the second region PR, thereby forming the first well region 3p and the second well region 3n. The substrate 1 may be a single-crystalline silicon wafer or a silicon-on-insulator (SOI) substrate. For example, the first well region 3p may be doped with dopants of first conductivity type, and the second well region 3n may be doped with dopants of second conductivity type. When the first well region 3p is formed, the second region PR may be covered by a mask pattern (e.g., a photoresist pattern). In addition, when the second well region 3n is formed, the first region NR may be covered by an additional mask pattern (e.g., a photoresist pattern).

Figure 5A:
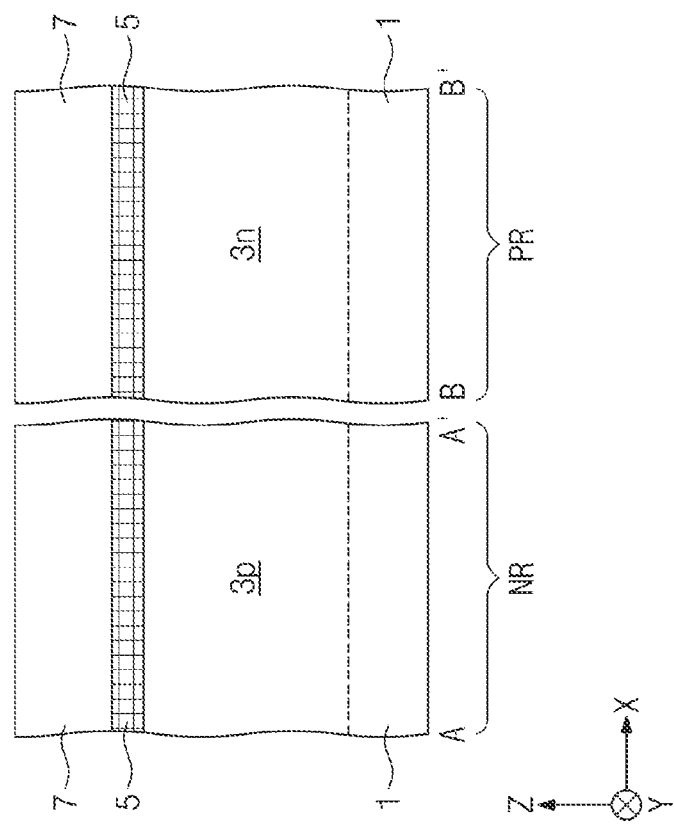
Figure 5B:
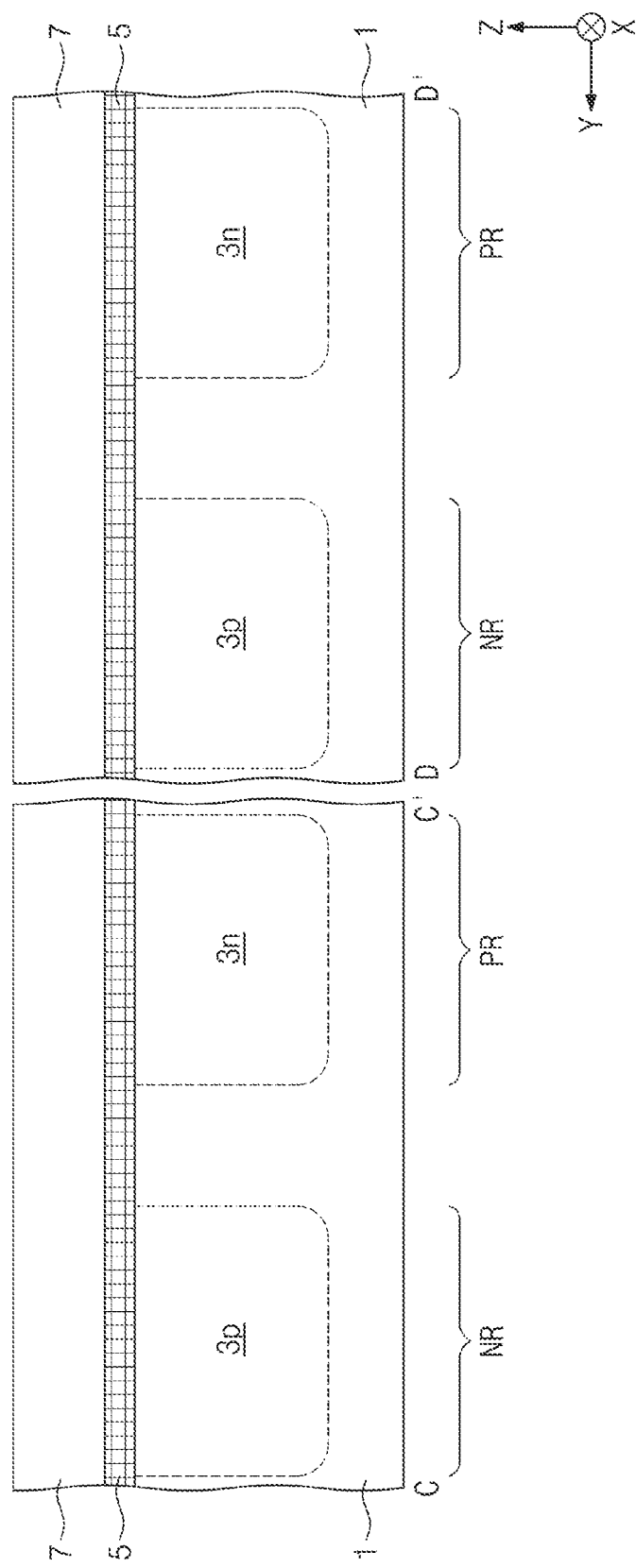

Referring to FIGS. 5A, 5B and 3, a superlattice layer 5 may now be formed on the top surface of the substrate 1. The superlattice layer 5 may be formed by the alternatingly stacking of semiconductor layers 5L1 and blocker-containing layers 5L2, as shown (e.g.,) in FIG. 3. The superlattice layer 5 may be formed by a selective epitaxial growth (SEG) process, a chemical vapor deposition (CVD) process, or an atomic layer deposition (ALD) process. For example, the process of forming the superlattice layer 5 may include a cycle including a first step of growing the semiconductor layer 5L1 (e.g., a silicon layer) by the SEG process and a second step of growing the blocker-containing layer 5L2 (e.g., a silicon layer) thereon by the SEG process while doping the blocker-containing layer 5L2 with blockers in-situ. The cycle may be performed once or repeated a number of times. An active fin layer 7 may be formed on the superlattice layer 5. The active fin layer 7 may include the same semiconductor material as the substrate 1. The active fin layer 7 may be formed by a selective epitaxial growth (SEG) process, a chemical vapor deposition (CVD) process, or an atomic layer deposition (ALD) process.

Figure 6A:
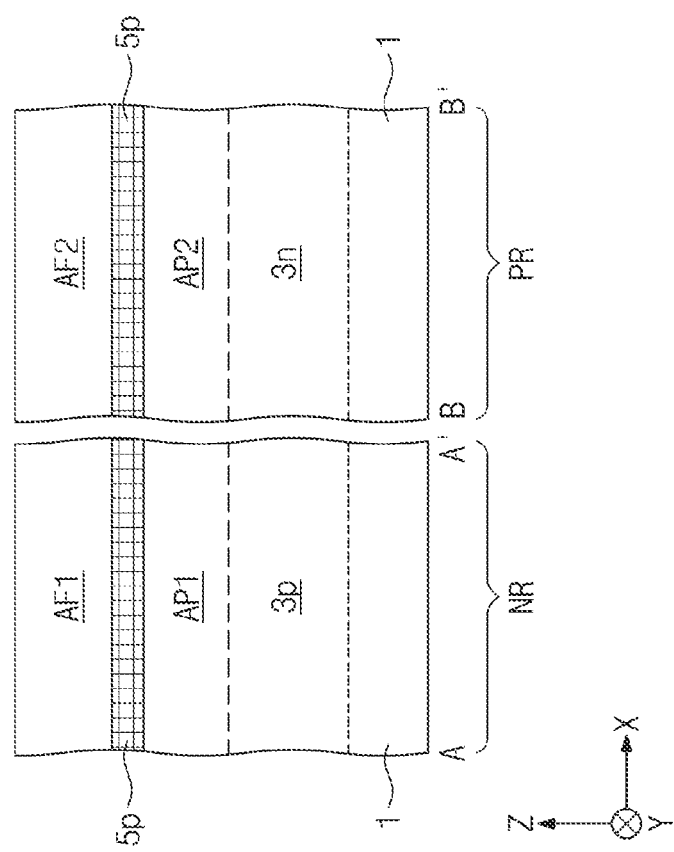
Figure 6B:
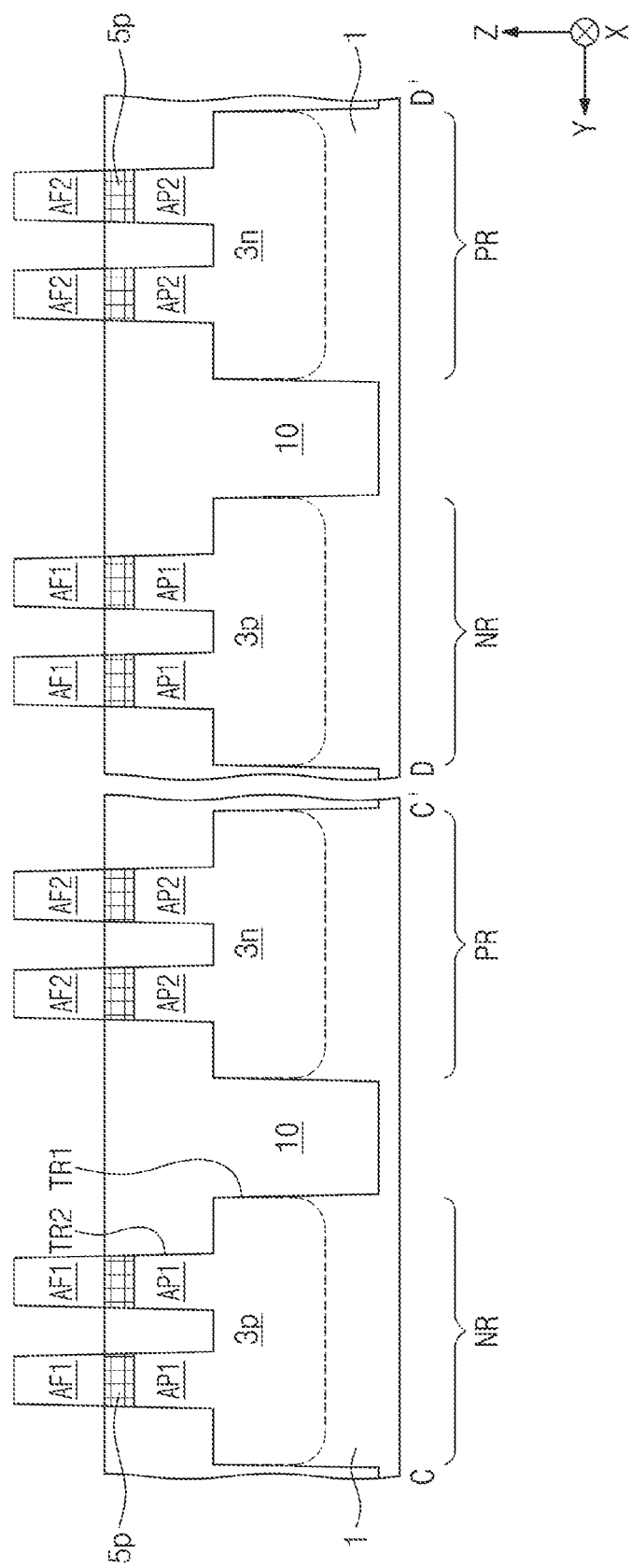

Referring to FIGS. 6A and 6B, the active fin layer 7, the superlattice layer 5 and the substrate 1 may be etched to form a first trench TR1 and a second trench TR2. The first trench TR1 may be deeper (as measured in the vertical direction Z) than the second trench TR2. The first trench TR1 may be located between the first region NR and the second region PR or between the first well region 3p and the second well region 3n. A number of second trenches TR2 may be formed on each of the first and second regions NR and PR. First active patterns AP1, superlattice patterns 5p and first active fins AF1 may be formed on the first region NR by the formation of the second trenches TR2. Second active patterns AP2, superlattice patterns 5p and second active fins AF2 may be formed on the second region PR by the formation of the second trenches TR2.

A device insolation layer may be formed on the top surface of the substrate 1, and an anisotropic etching process may be performed on the device insolation layer to form a device isolation structure 10 filling the whole of the first trench TR1 and portions of the second trenches TR2. Sidewalls of the first and second active fins AF1 and AF2 may be exposed on the device insolation structure 10. Here, the first and second active fins AF1 and AF2 may have the same planar shapes as the first and second active patterns AP1 and AP2 of FIG. 1. Sidewalls of the first and second active patterns AP1 and AP2 and the superlattice patterns 5p may be covered by the device insolation structure 10.

Figure 7A:
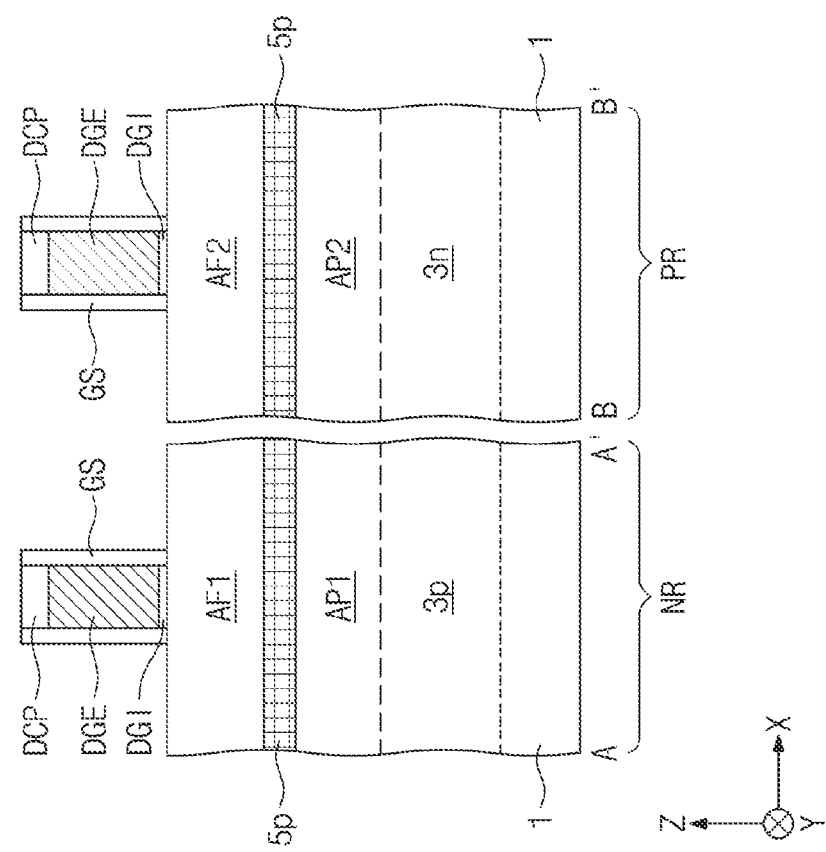
Figure 7B:
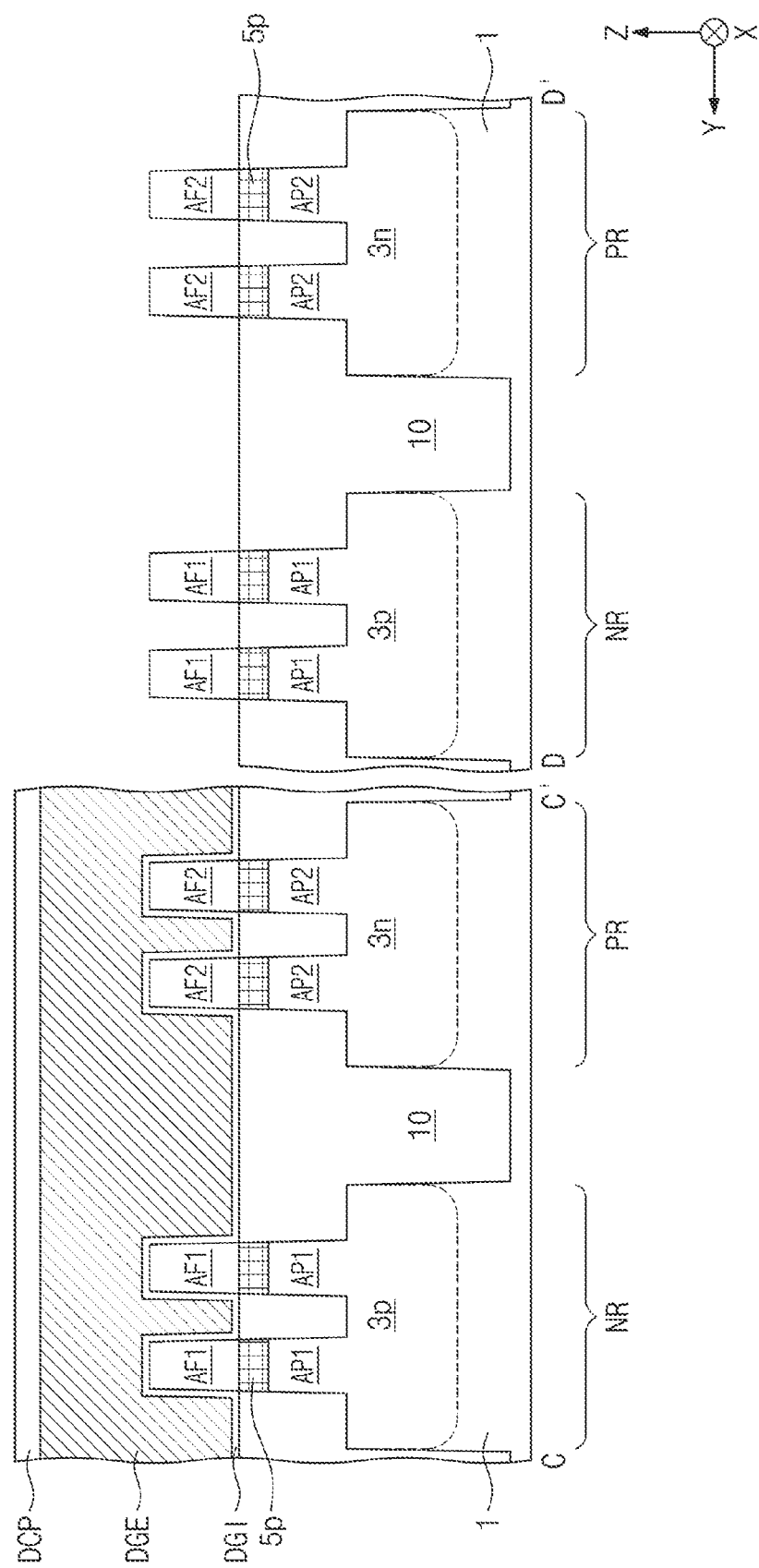
Figure 8A:
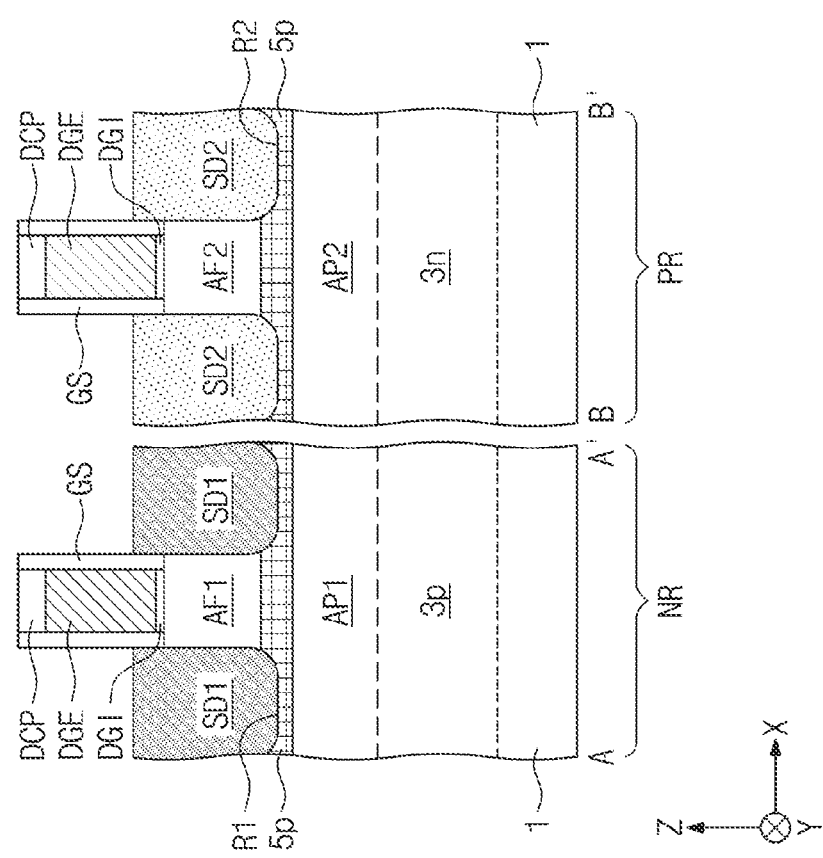
Figure 8B:
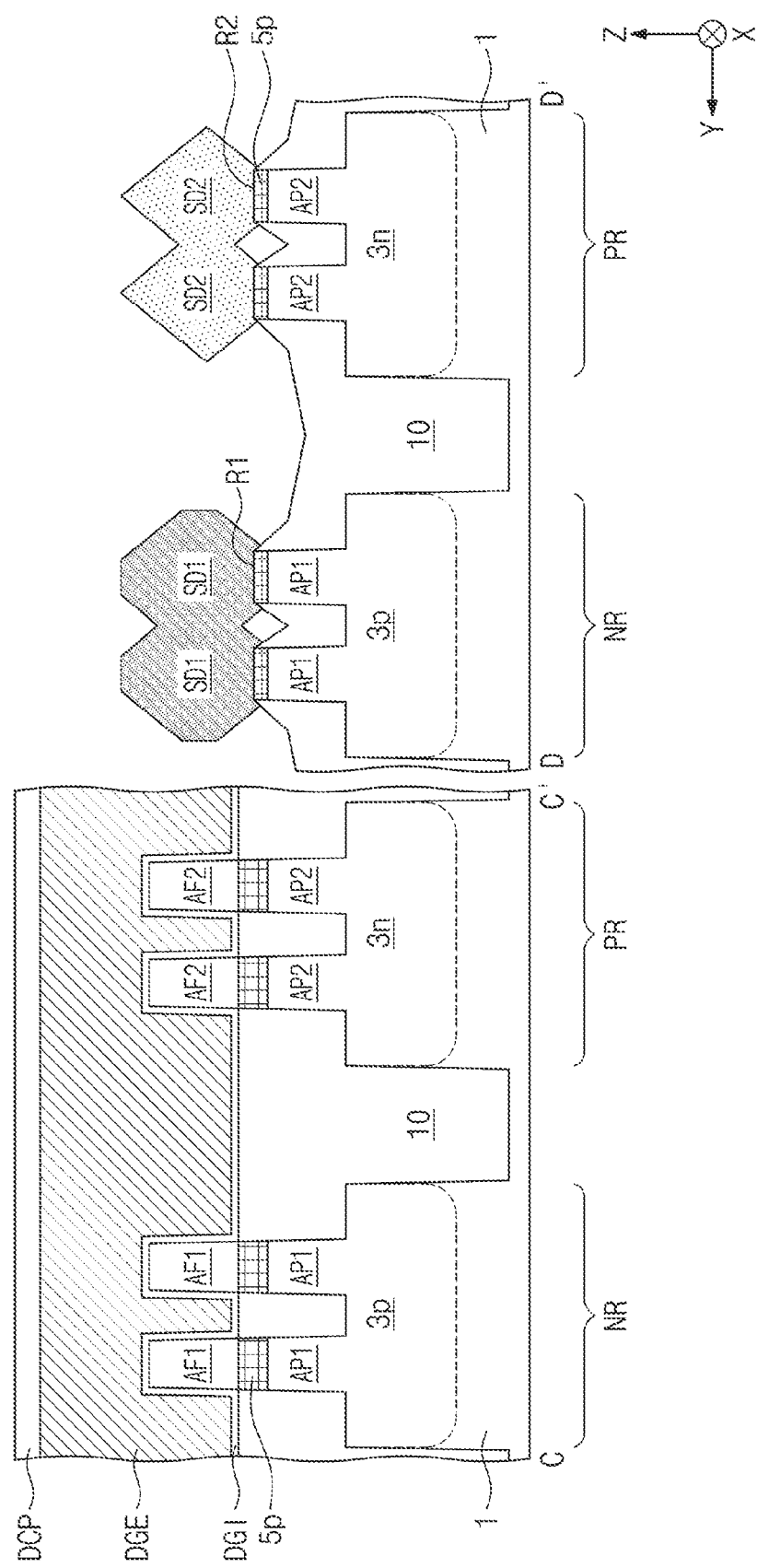
Figure 9A:
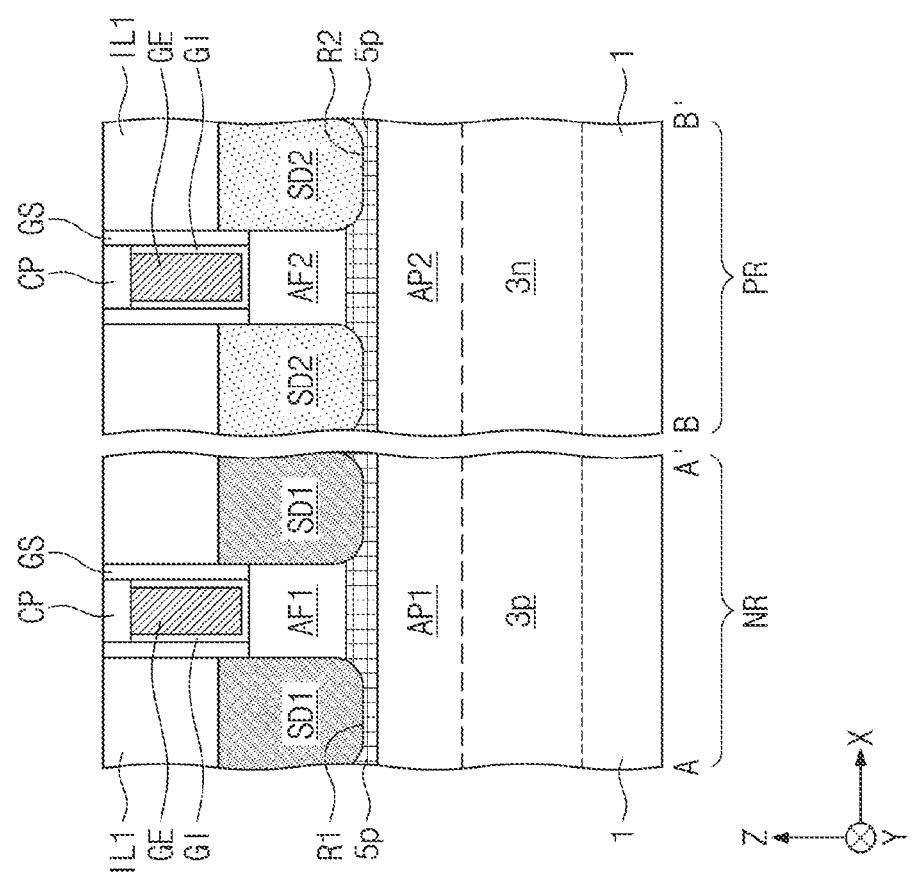
Figure 9B:
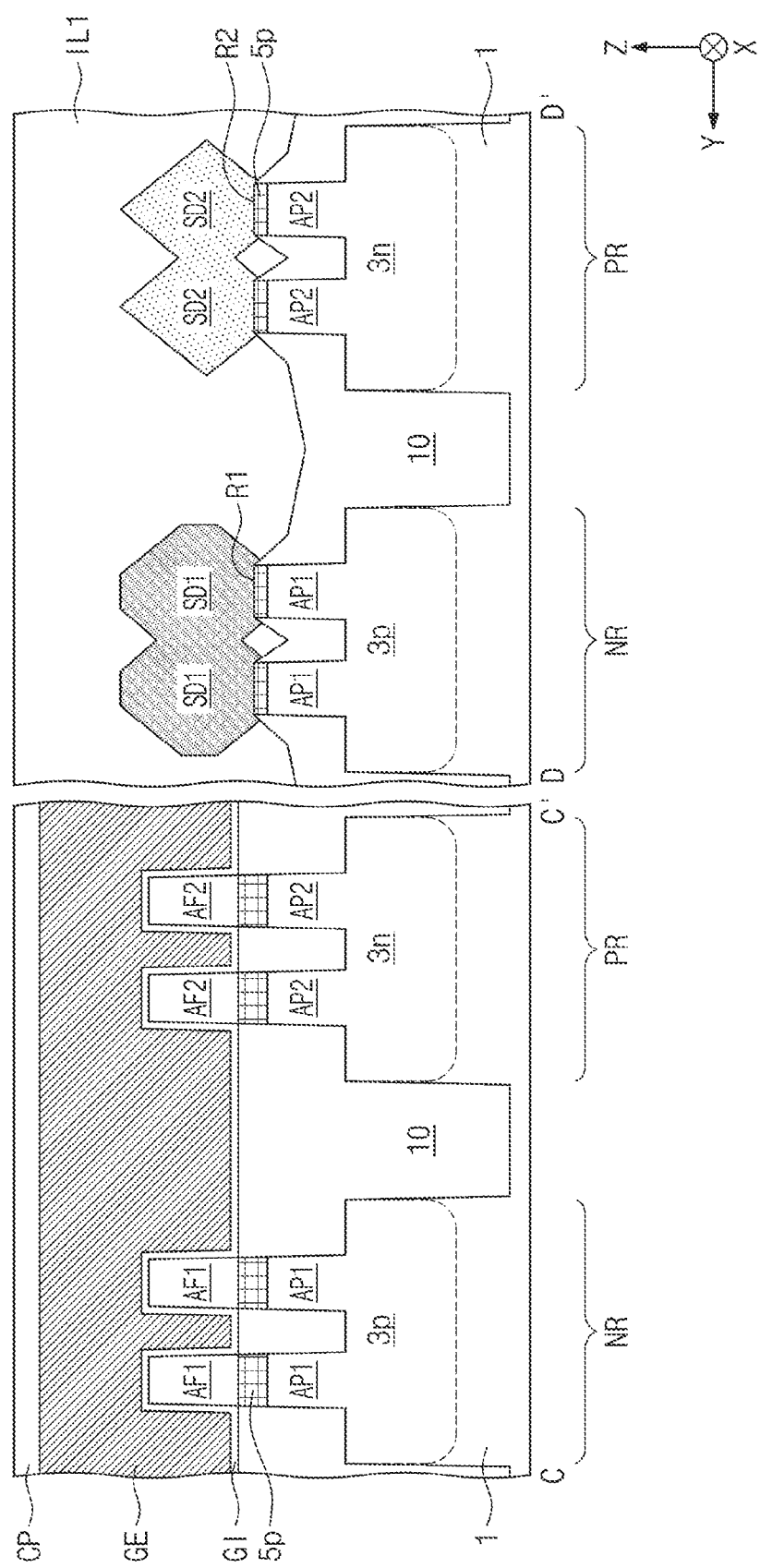
Figure 10A:
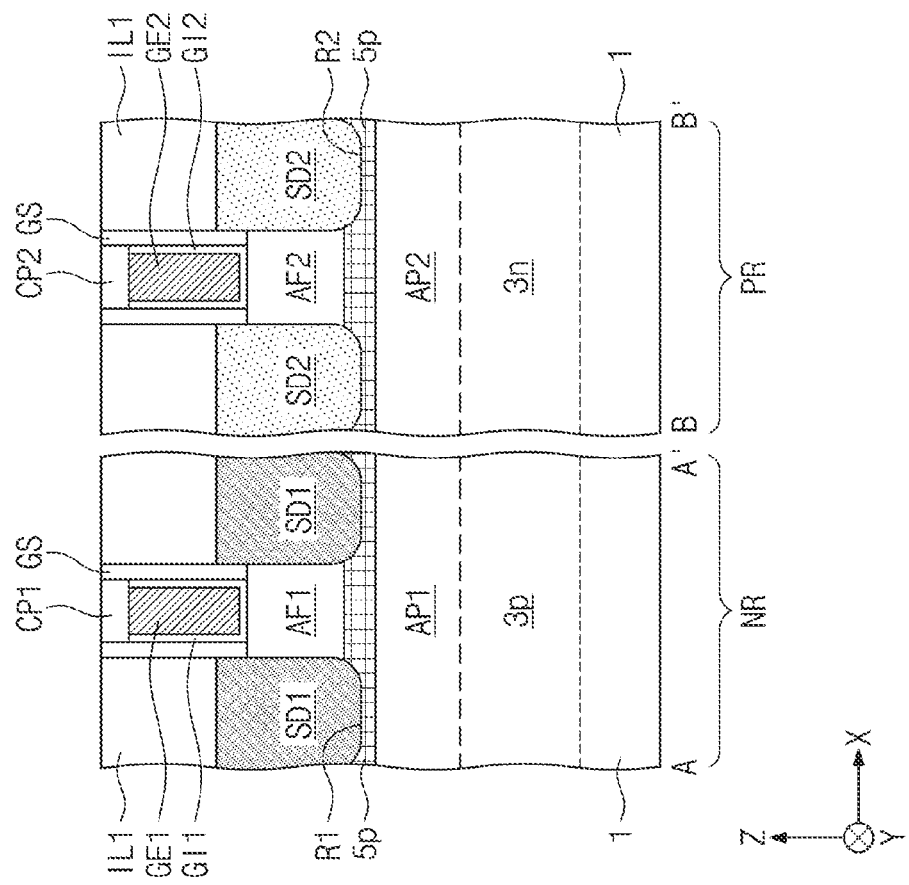
Figure 10B:
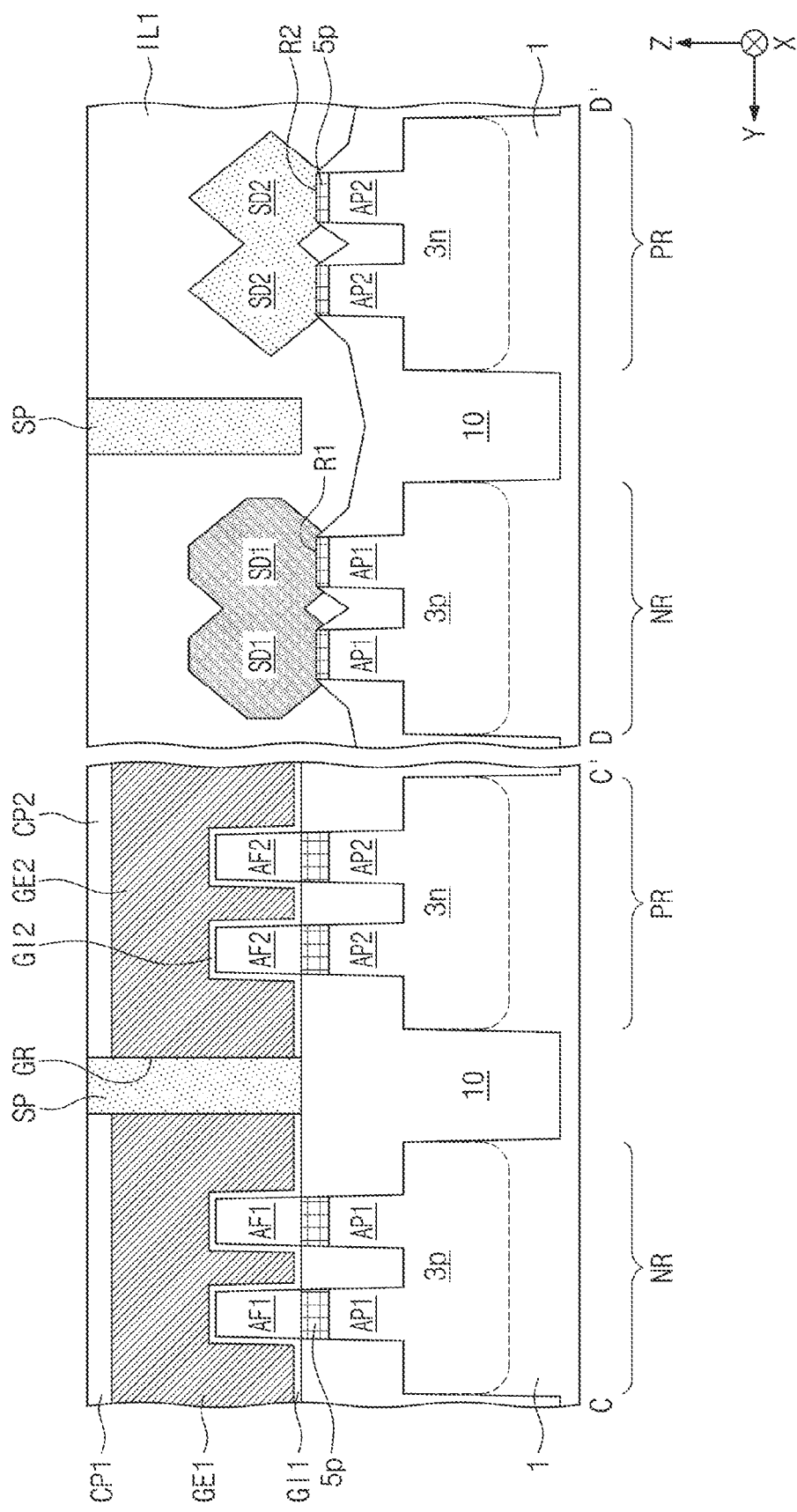

Referring to FIGS. 7A and 7B, a dummy gate insulating layer DGI, a dummy gate electrode DGE and a dummy capping pattern DCP may be formed to intersect the first and second active fins AF1 and AF2. The dummy gate insulating layer DGI may be formed of, for example, a silicon oxide layer. The dummy gate electrode DGE may be formed of, for example, a poly-silicon layer. The dummy capping pattern DCP may be formed of, for example, a silicon nitride layer. Gate spacers GS may be formed to cover sidewalls of the dummy gate insulating layer DGI, the dummy gate electrode DGE and the dummy capping pattern DCP.

Referring to FIGS. 7A, 7B, 8A and 8B, the first active fins AF1 at both sides of the dummy gate electrode DGE may be etched to form first recess regions R1. At this time, upper portions of the superlattice patterns 5p may also be partially etched. A SEG process may be performed to form first source/drain patterns SD1 in the first recess regions RE When the SEG process is performed, the first source/drain patterns SD1 may be doped in-situ with dopants of the second conductivity type (e.g., an N-type). In addition, the second active fins AF2 at both sides of the dummy gate electrode DGE may be etched to form second recess regions R2. Here, upper portions of the superlattice patterns 5p may also be partially etched. A SEG process may be performed to form second source/drain patterns SD2 in the second recess regions R2. When the SEG process is performed, the second source/drain patterns SD2 may be doped in-situ with dopants of first conductivity type (e.g., P-type dopants).

Referring to FIGS. 8A, 8B, 9A and 9B, a first interlayer insulating layer IL1 may be formed to cover the source/drain patterns SD1 and SD2. The first interlayer insulating layer IL1 may expose a top surface of the dummy capping pattern DCP. The dummy capping pattern DCP, the dummy gate electrode DGE and the dummy gate insulating layer DGI may be removed, and a gate insulating layer GI, a gate electrode GE and a gate capping pattern CP may be formed. The gate insulating layer GI may be formed to cover top surfaces of the first and second active fins AF1 and AF2 and inner sidewalls of the gate spacers GS. The gate electrode GE may include, for example, a metal such as tungsten. The gate capping pattern CP may include, for example, a silicon nitride layer.

Referring to FIGS. 9A, 9B, 10A and 10B, portions of the gate capping pattern CP, the gate electrode GE and the gate insulating layer GI on the substrate 1 between the first and second regions NR and PR may be removed to form a groove GR which extends in the first horizontal direction X and exposes the device insolation structure 10. Here, the gate electrode GE may be divided into first and second gate electrodes GE1 and GE2. Likewise, the gate insulating layer GI may be divided into first and second gate insulating layers GI1 and GI2, and the gate capping pattern CP may be divided into first and second gate capping patterns CP1 and CP2. Subsequently, a gate separation pattern SP may be formed by filling the groove GR with an insulating material. The gate separation pattern SP may be formed of an insulating material having an etch selectivity with respect to the first interlayer insulating layer ILE In some embodiments, the first and second gate electrodes GE1 and GE2 may be formed at the same time, and the first and second gate insulating layers GI1 and GI2 may be formed at the same time. Alternatively, the first and second gate electrodes GE1 and GE2 may be formed of different materials using different processes, and/or the first and second gate insulating layers GI1 and GI2 may be formed of different materials using different processes. Subsequent processes may be performed to complete manufacture the semiconductor device of FIGS. 1, 2A and 2B.

Figure 11A:
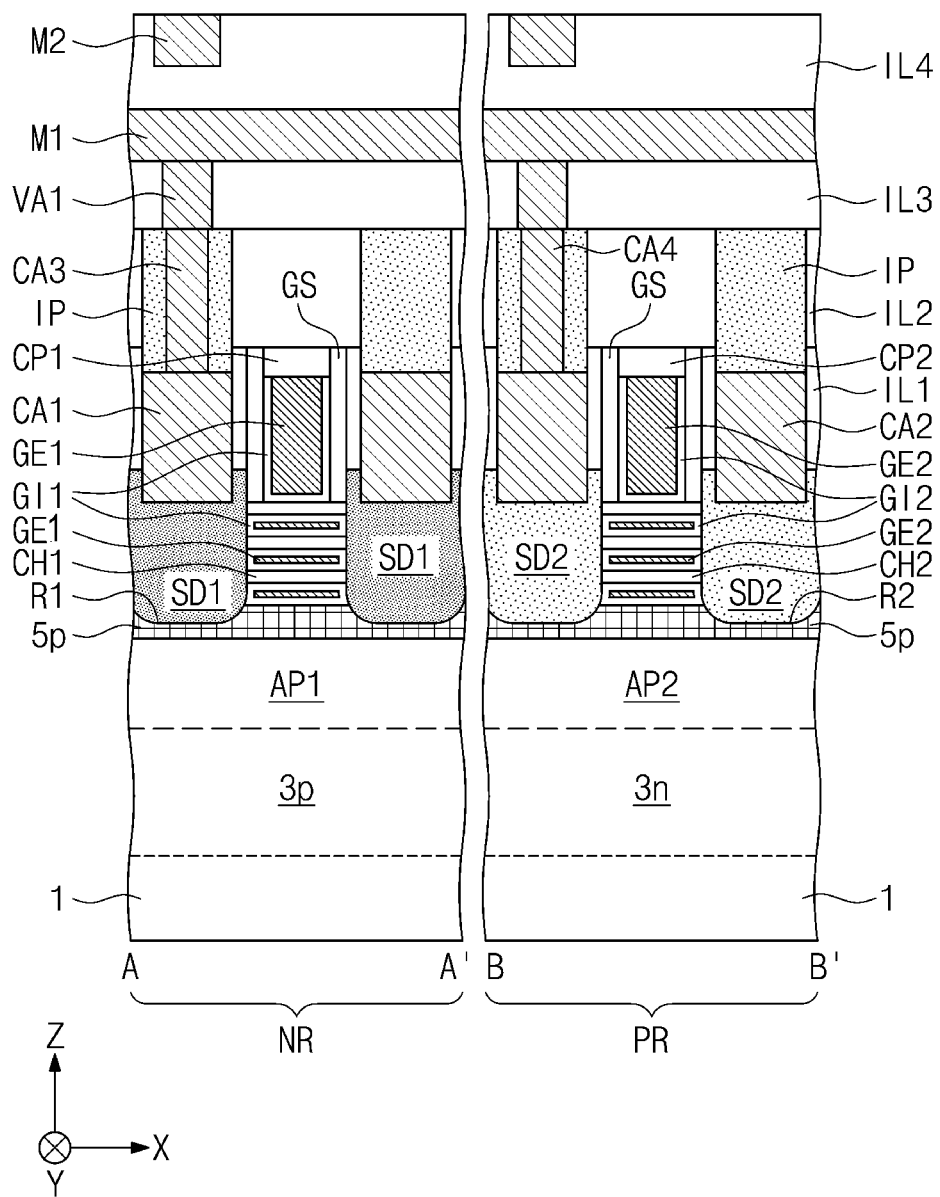
FIGS. 11A, 12, 13, 14A, 15, 16, 17, 18, 19 and 21 are respective cross-sectional views taken along the lines A-A' and B-B' of FIG. 1.
Figure 11B:
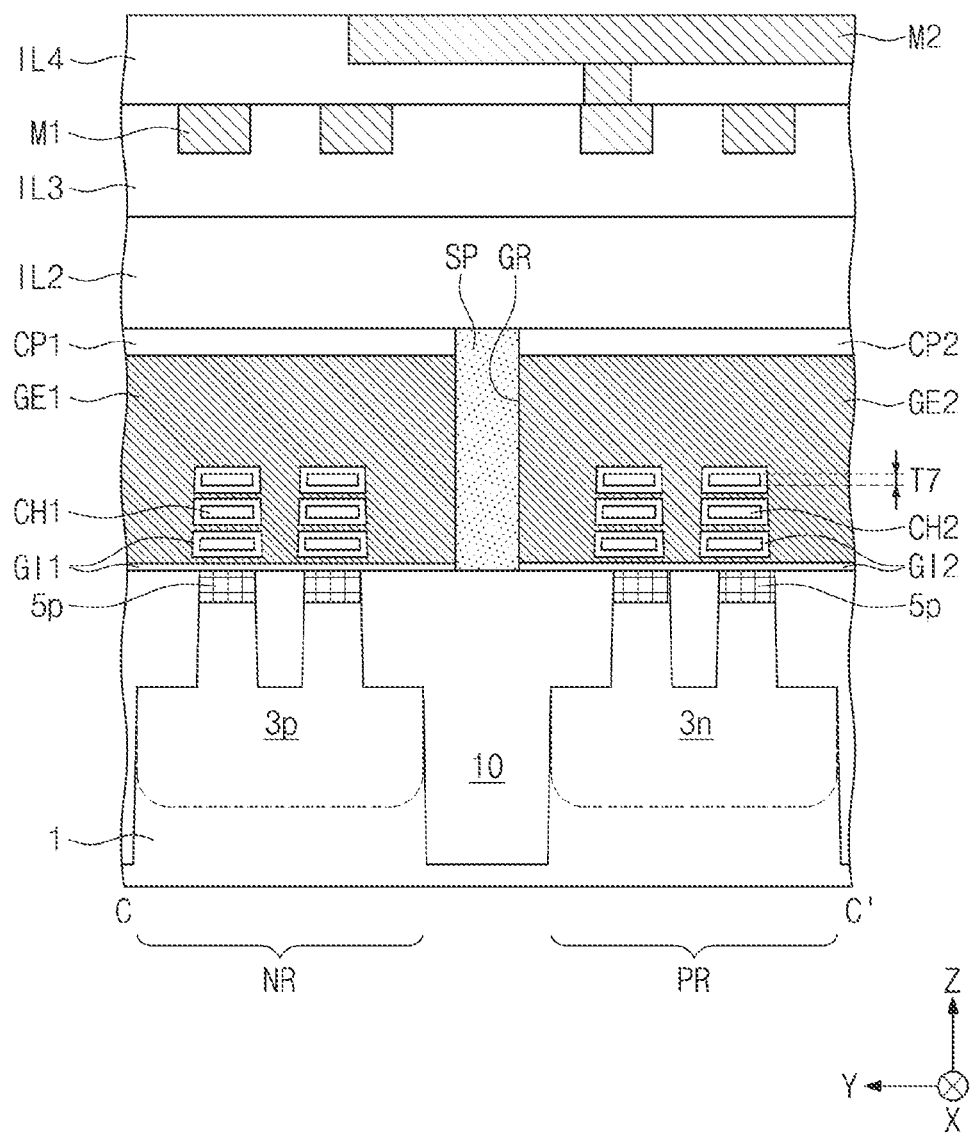
FIG. 11B is a cross-sectional view taken along the line C-C' of FIG. 1.

FIG. 11A is a cross-sectional view taken along the lines A-A' and B-B' of FIG. 1, and FIG. 11B is a cross-sectional view taken along the line C-C' of FIG. 1.

Referring to FIGS. 11A and 11B, a semiconductor device may include multi-bridge channel field effect transistors (MBCFETs). First channel patterns CH1 may be vertically stacked on a superlattice pattern 5p provided on a first region NR. The first channel patterns CH1 may be disposed between first source/drain patterns SD1. A first gate electrode GE1 may extend to be disposed between the first channel patterns CH1. In addition, the first gate electrode GE1 may also be disposed between the superlattice pattern 5p and a lowermost one of the first channel patterns CH1. A first gate insulating layer GI1 may be disposed between the first gate electrode GE1 and the first channel patterns CH1, between the first gate electrode GE1 and the first source/drain patterns SD1 and between the first gate electrode GE1 and the superlattice pattern 5p. The superlattice pattern 5p may be in contact with the first gate insulating layer GI1.

Second channel patterns CH2 may be vertically stacked on a superlattice pattern 5p provided on a second region PR. The second channel patterns CH2 may be disposed between second source/drain patterns SD2. A second gate electrode GE2 may extend to be disposed between the second channel patterns CH2. In addition, the second gate electrode GE2 may also be disposed between the superlattice pattern 5p and a lowermost one of the second channel patterns CH2. A second gate insulating layer GI2 may be disposed between the second gate electrode GE2 and the second channel patterns CH2, between the second gate electrode GE2 and the second source/drain patterns SD2 and between the second gate electrode GE2 and the superlattice pattern 5p. The superlattice pattern 5p may be in contact with the second gate insulating layer GI2. Each of the first channel patterns CH1 and/or the second channel patterns CH2 may have a seventh thickness T7. For example, the seventh thickness T7 may range from between about 5 nm to 15 nm.

The embodiments illustrated in FIGS. 11A and 11B may correspond to semiconductor devices in which the first active fin AF1 of FIG. 2A is replaced with the first channel patterns CH1, and the second active fin AF2 of FIG. 2A is replaced with the second channel patterns CH2. Other elements and/or components may be the same or similar as described with reference to FIGS. 2A and 2B.

In the semiconductor device of FIGS. 11A and 11B, the gate electrodes GE1 and GE2 may be disposed between the lowermost channel patterns CH1 and CH2 and the superlattice patterns 5p. Thus, all of the channel patterns CH1 and CH2 may be easily controlled. As a result, reliability of the semiconductor device may be improved.

To manufacture the semiconductor device of FIGS. 11A and 11B, channel layers and sacrificial layers may be alternately stacked instead of the formation of the active fin layer 7 using step(s) like those shown (e.g.,) in FIGS. 5A and 5B. Additionally, in the step(s) shown in FIGS. 9A and 9B, empty spaces may be formed by removing the sacrificial layers after the removal of the dummy gate electrode DGE, and then, the subsequent processes may be performed to form the gate electrodes GE1 and GE2 and the gate insulating layers GI1 and GI2 in the empty spaces.

Figure 12:
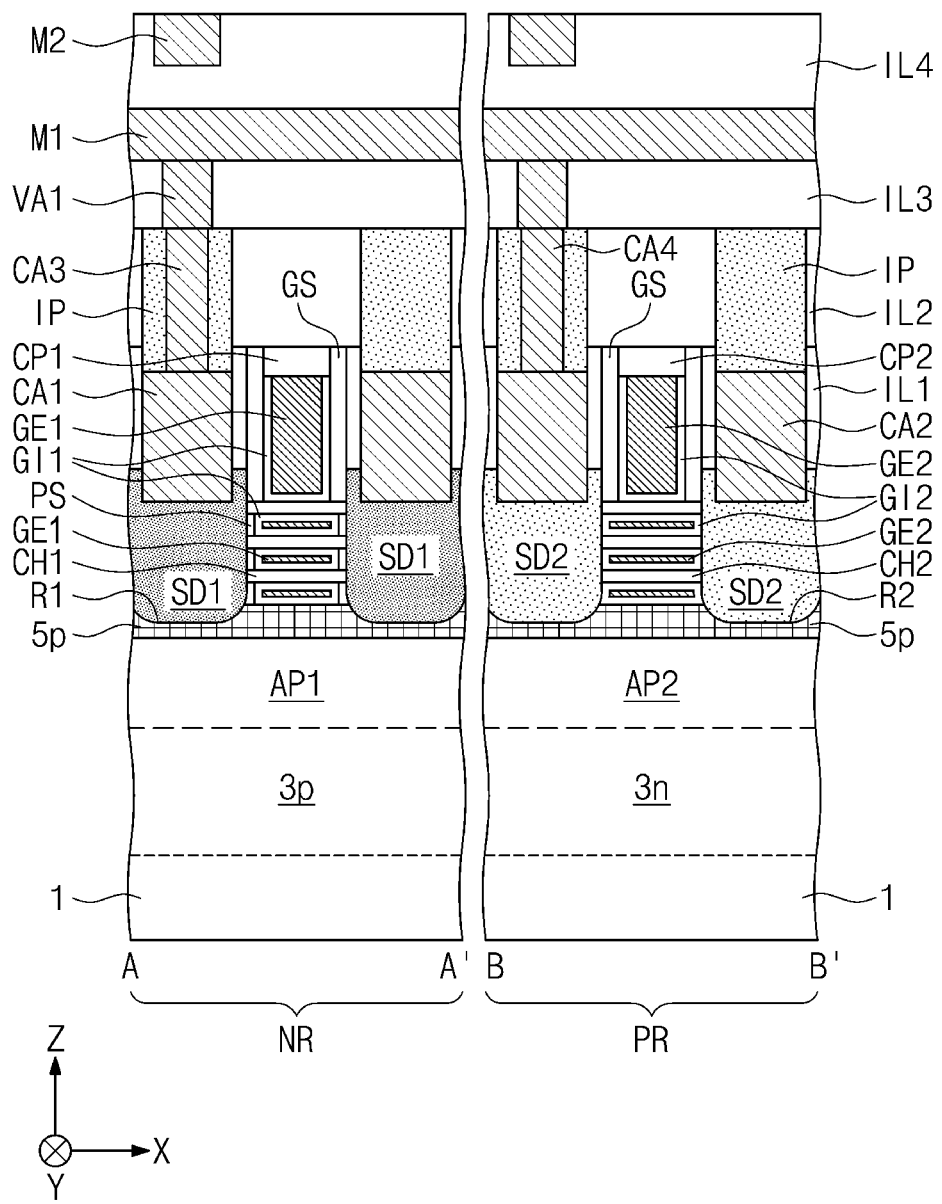
Figure 13:
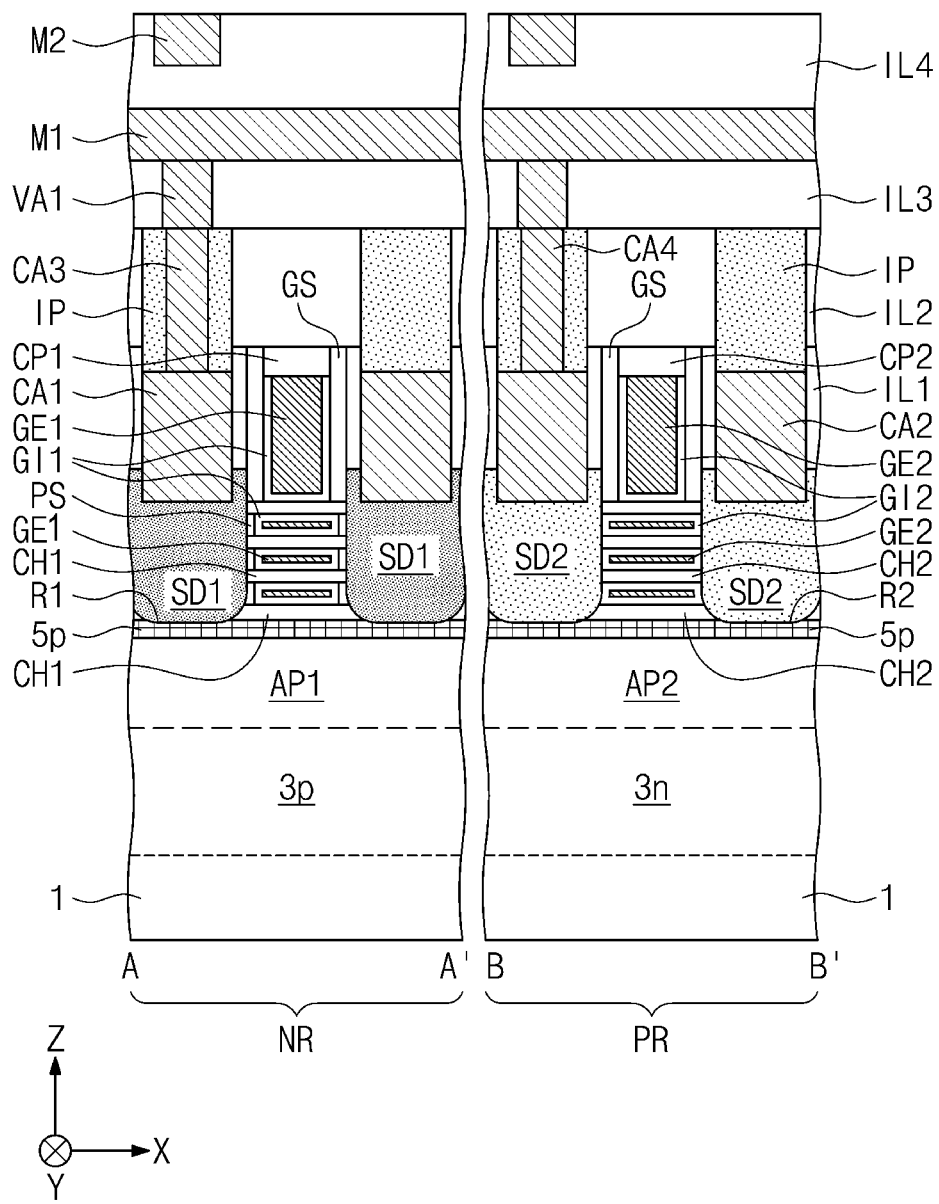

FIGS. 12 and 13 are respective cross-sectional views taken along the lines A-A' and B-B' of FIG. 1.

Referring to FIG. 12, an insulating spacer PS may be disposed between the first gate insulating layer GI1 and the first source/drain pattern SD1 on the first region NR. The insulating spacer PS may include, for example, silicon nitride. Even though not shown in the drawings, the insulating spacer PS may also be disposed between the second gate insulating layer GI2 and the second source/drain pattern SD2 on the second region PR. Other elements and components may be the same or similar as described with reference to FIGS. 11A and 11B.

Referring to FIG. 13, on the first region NR, the first gate insulating layer GI1 may not be in contact with the superlattice pattern 5p but may be spaced apart from the superlattice pattern 5p. The first channel pattern CH1 may be disposed between the first gate insulating layer GI1 and the superlattice pattern 5p. The first channel pattern CH1 may be in contact with the semiconductor layer 5L1 (see FIG. 3) or the blocker-containing layer 5L2 (see FIG. 3) of the superlattice pattern 5p. In addition, on the second region PR, the second gate insulating layer GI2 may not be in contact with the superlattice pattern 5p but may be spaced apart from the superlattice pattern 5p. The second channel pattern CH2 may be disposed between the second gate insulating layer GI2 and the superlattice pattern 5p. Other elements and components may be the same or similar as described with reference to FIG. 12. In the illustrated embodiment of FIG. 13, the superlattice patterns 5p may not be exposed, but lowermost channel patterns CH1 and CH2 may be exposed when the sacrificial layers are removed during the step(s) described in relation to FIGS. 11A and 11B. Thus, damage of the superlattice patterns 5p may be prevented, and as a result, the overall reliability of the semiconductor device may be improved.

Figure 14A:
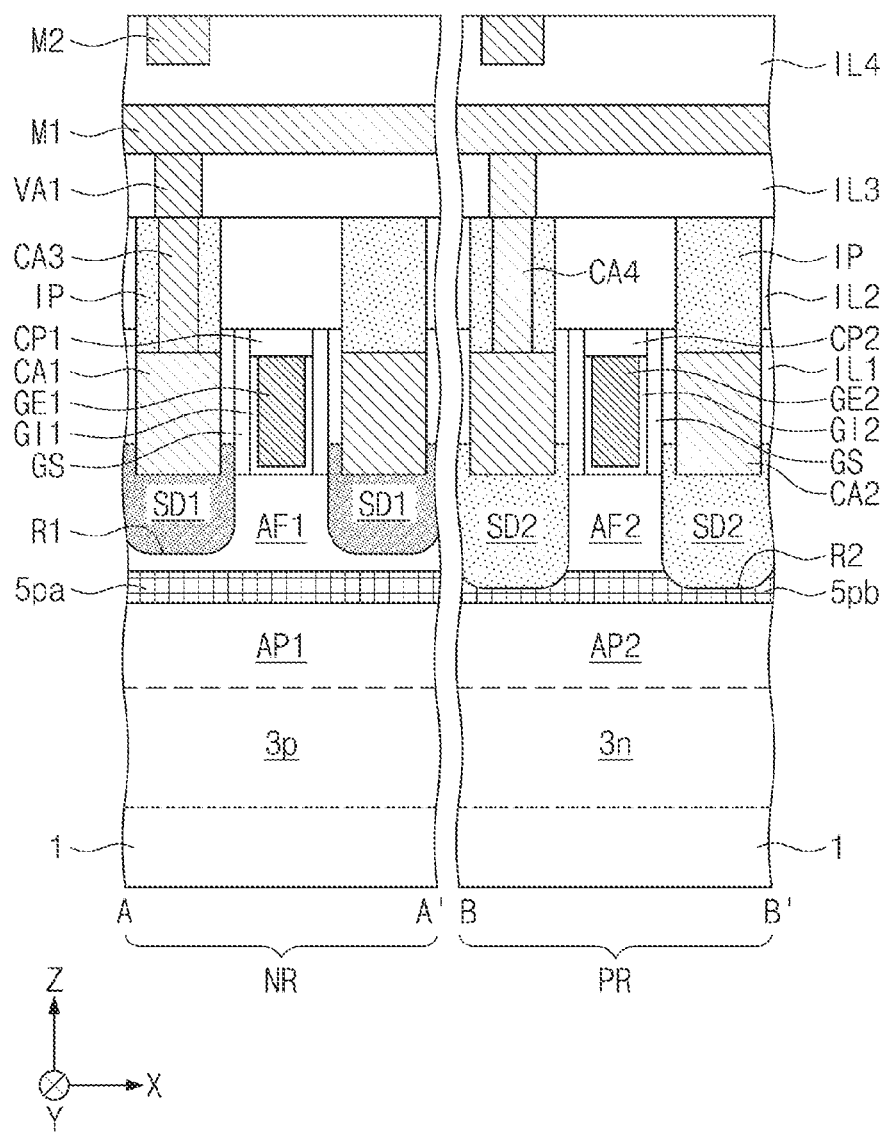
Figure 14B:
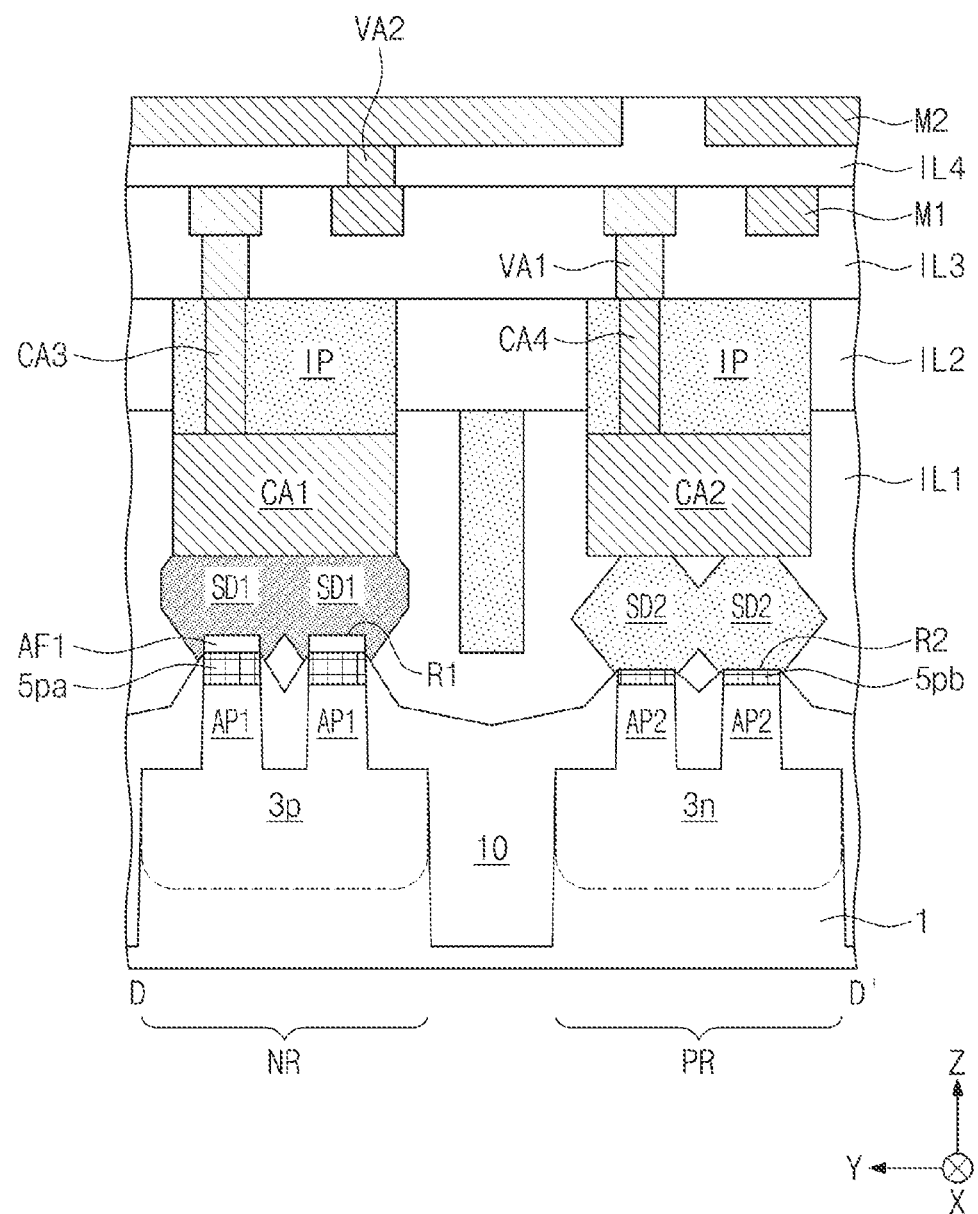
FIG. 14B is a cross-sectional view taken along the line D-D' of FIG. 1.

FIG. 14A is a cross-sectional view taken along the lines A-A' and B-B' of FIG. 1, and FIG. 14B is a cross-sectional view taken along the line D-D' of FIG. 1.

Referring to FIGS. 14A and 14B, a first superlattice pattern 5pa may be spaced apart from the first source/drain pattern SD1 on the first region NR. A portion of the first active fin AF1 may be disposed between the first source/drain pattern SD1 and the first superlattice pattern 5pa. A second superlattice pattern 5pb may be in contact with the second source/drain pattern SD2 on the second region PR. The first recess region R1 may be shallower than the second recess region R2. Each of the first and second superlattice patterns 5pa and 5pb may include semiconductor layers 5L1 and blocker-containing layers 5L2 which are alternately and repeatedly stacked, as described with reference to FIG. 3. The first and second superlattice patterns 5pa and 5pb may include the same blockers. Alternatively, since the type of dopants doped in the first source/drain pattern SD1 is different from the type of dopants doped in the second source/drain pattern SD2, the blockers contained in the first superlattice pattern 5pa may be different from the blockers contained in the second superlattice pattern 5pb. Thus, performance of these transistors may be further optimized. Other elements and components may be the same or similar as those described in relation to FIGS. 2A and 2B.

FIGS. 15, 16, 17, 18 and 19 are respective cross-sectional views taken along the lines A-A' and B-B' of FIG. 1.

Figure 15:
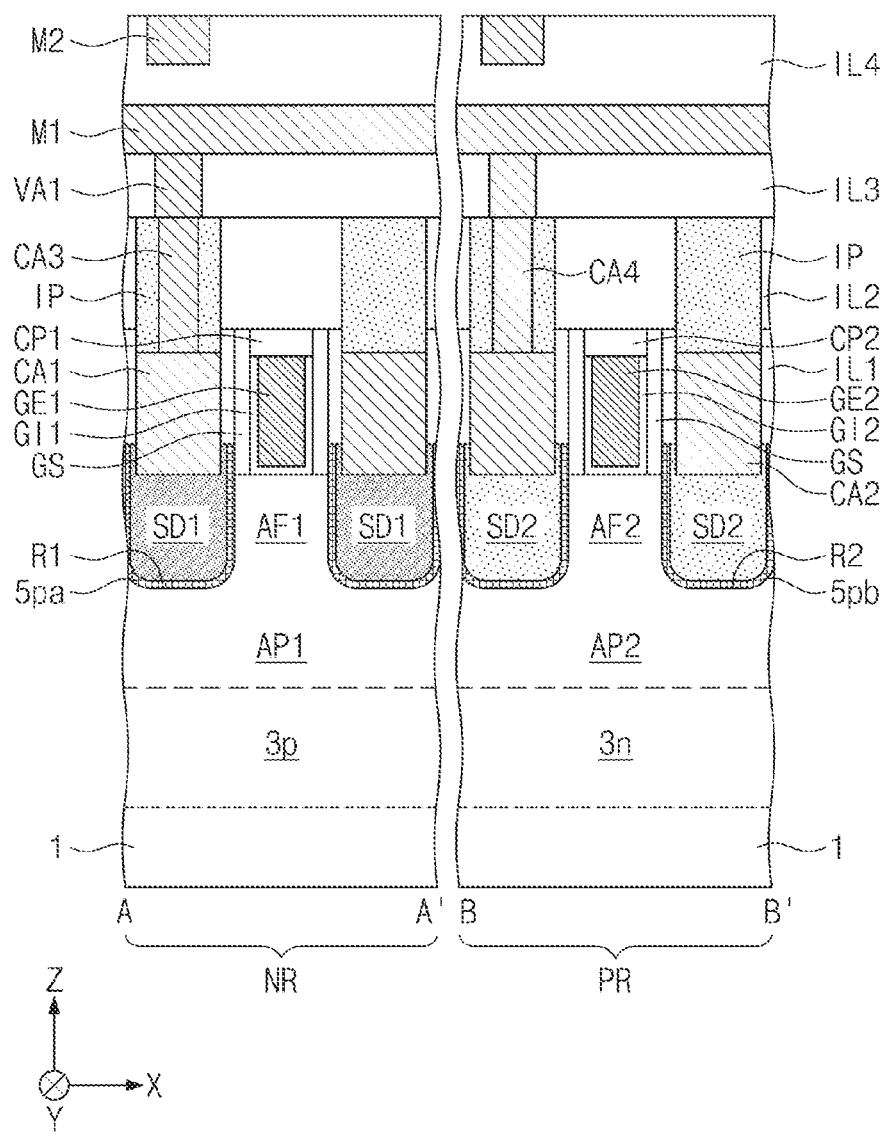

Referring to FIG. 15, a first superlattice pattern 5pa may be in contact with a bottom surface and a sidewall of the first source/drain pattern SD1. A second superlattice pattern 5pb may be in contact with a bottom surface and a sidewall of the second source/drain pattern SD2. The first superlattice pattern 5pa may not be formed in the step of FIGS. 5A and 5B but may be formed after the formation of the first recess region R1 and before the formation of the first source/drain pattern SD1 in the step of FIGS. 8A and 8B. In addition, the second superlattice pattern 5pb may be formed after the formation of the second recess region R2 and before the formation of the second source/drain pattern SD2. The first and second superlattice patterns 5pa and 5pb may be conformally formed with substantially uniform thicknesses. In FIG. 15, top ends of the first and second superlattice patterns 5pa and 5pb are located at the same height (or level) as top ends of the first and second source/drain patterns SD1 and SD2. Alternatively, the first and second source/drain patterns SD1 and SD2 may protrude from the top ends of the first and second superlattice patterns 5pa and 5pb. In addition, the first and second source/drain patterns SD1 and SD2 may cover the top ends of the first and second superlattice patterns 5pa and 5pb. The superlattice patterns 5pa and 5pb are not disposed between the active fins AF1 and AF2 and the active patterns AP1 and AP2. The active fins AF1 and AF2 may be connected to the active patterns AP1 and AP2, respectively. Other elements and components may be the same or similar as those described in relation to FIGS. 14A and 14B.

Figure 16:
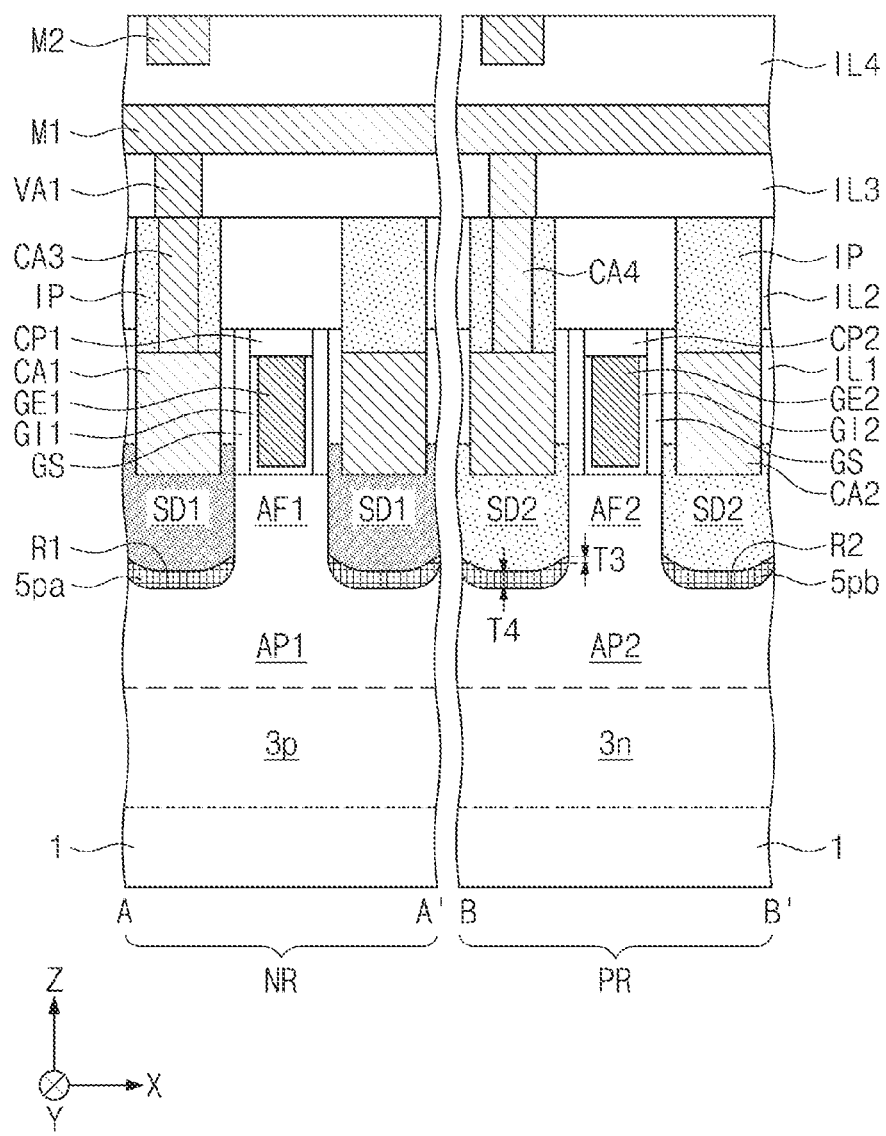

Referring to FIG. 16, a first superlattice pattern 5pa may be in contact with the bottom surface of the first source/drain pattern SD1 but may not cover the sidewall of the first source/drain pattern SD1. A second superlattice pattern 5pb may be in contact with the bottom surface of the second source/drain pattern SD2 but may not cover the sidewall of the second source/drain pattern SD2. Each of the first and second superlattice patterns 5pa and 5pb may have a third thickness T3 at an edge of the bottom surface of each of the first and second source/drain patterns SD1 and SD2 and may have a fourth thickness T4 under a central portion of the bottom surface of each of the first and second source/drain patterns SD1 and SD2. In some embodiments, the fourth thickness T4 may be greater than the third thickness T3. Other elements and components may be the same or similar as those described in relation to FIG. 15.

Figure 17:
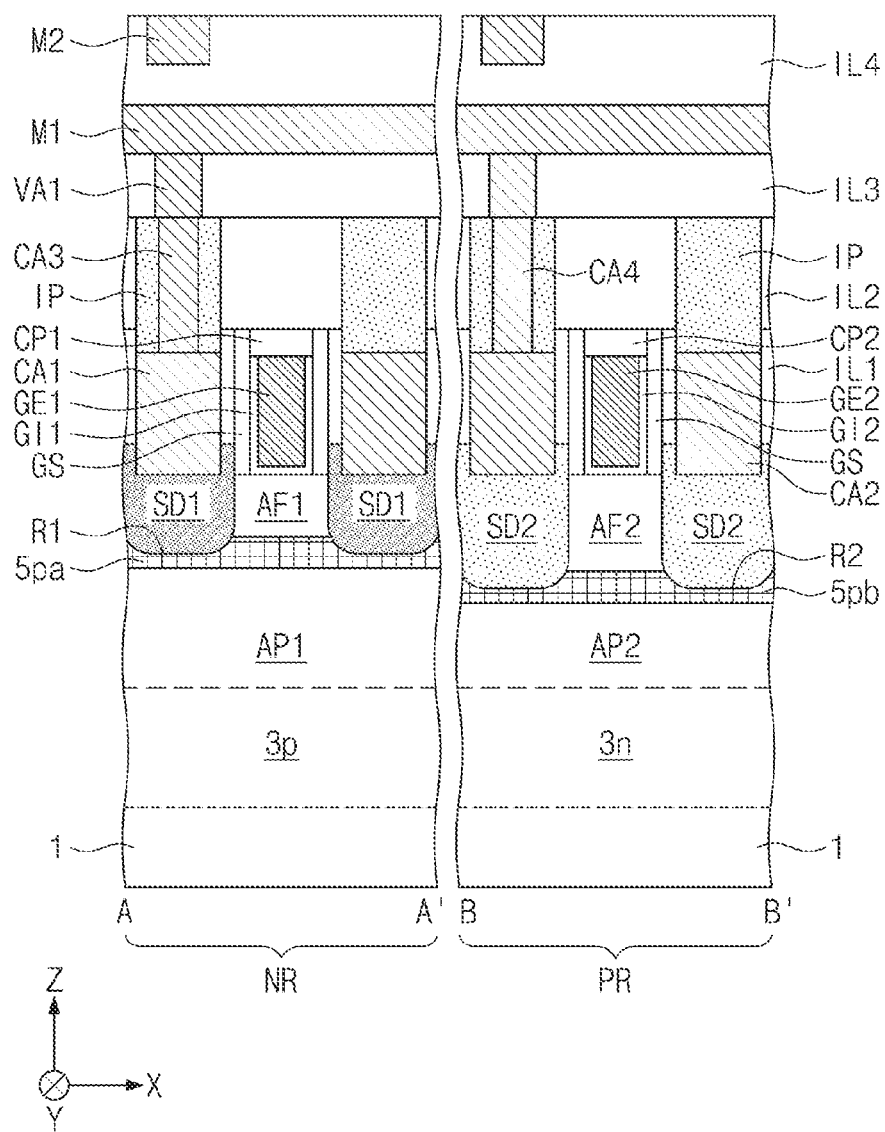

Referring to FIG. 17, a first height (or level) of a first superlattice pattern 5pa on the first region NR may be different from a second height (or level) of a second superlattice pattern 5pb on the second region PR. In some embodiments, the first height of the first superlattice pattern 5pa may be greater than the second height of the second superlattice pattern 5pb. Here, a bottom surface of the first source/drain pattern SD1 may be above a bottom surface of the second source/drain pattern SD2. A thickness of the first superlattice pattern 5pa may be equal to a thickness of the second superlattice pattern 5pb. Other elements and components may be the same or similar as those described in relation to FIG. 14A.

Figure 18:
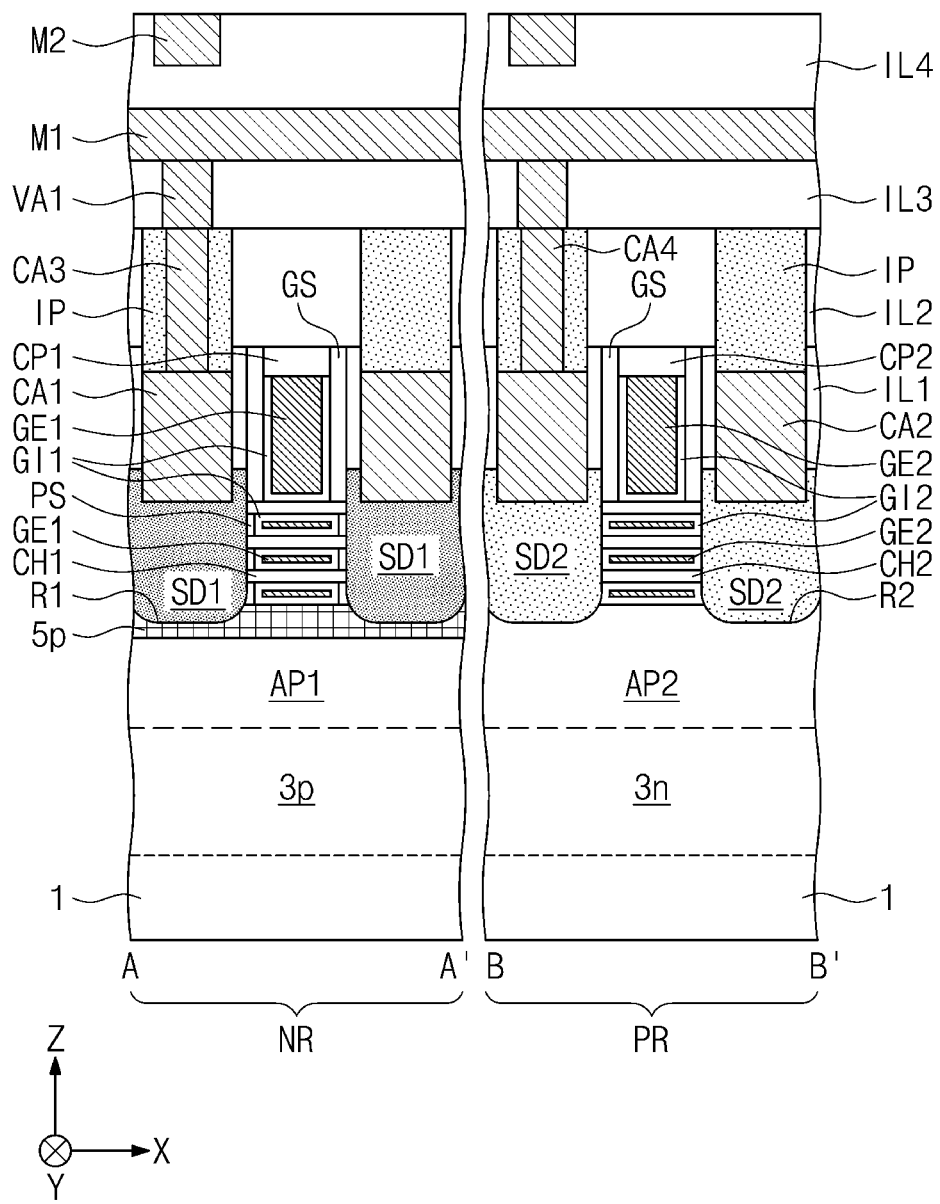

Referring to FIG. 18, a superlattice pattern 5p may be provided on the first region NR, but may not be provided on the second region PR. Thus, the second gate insulating layer GI2 may be in direct contact with the second active pattern AP2 on the second region PR. Other elements and components may be the same or similar as those described in relation to FIG. 12.

In this regard, the embodiment of FIG. 18 shows a case in which the superlattice pattern 5p is more specifically located. For example, phosphorus (P) doped in a source/drain pattern of an NMOS transistor may diffuse into surrounding region(s) and create a short channel effect and/or reduce charge mobility. Alternatively or additionally, boron doped in silicon-germanium of a source/drain pattern of a PMOS transistor may be relatively less diffused. Thus, the superlattice pattern 5p may be selectively formed in only a region more likely to cause a defect as the result of dopant diffusion.

Figure 19:
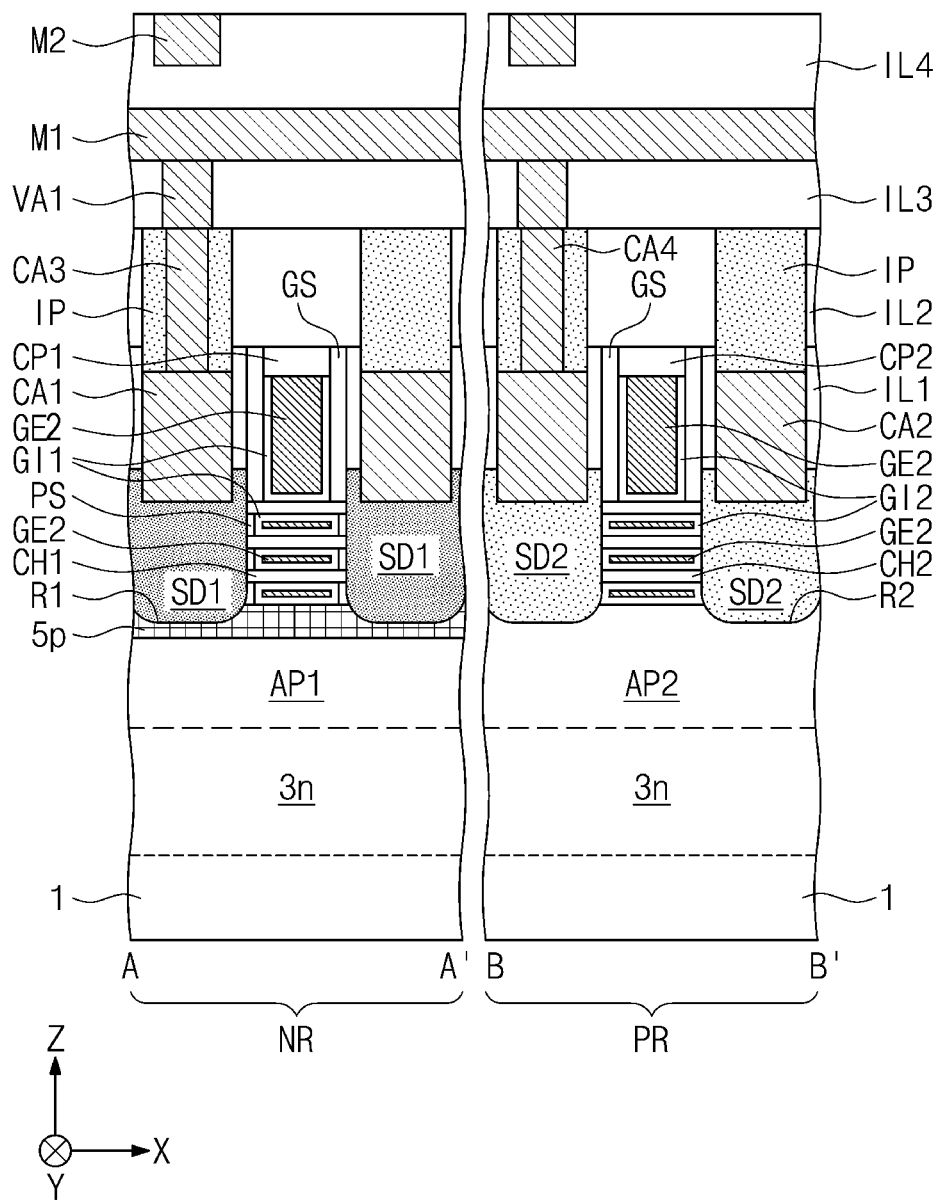

Referring to FIG. 19, the second well region 3n may be formed in the substrate 1 of both the first region NR and the second region PR. Other elements and components may be the same or similar as those described in relation to FIG. 18. Here, the superlattice pattern 5p may be disposed on the first region NR to sufficiently block migration of dopants doped in the first source/drain pattern SD1, and thus the first well region 3p (see e.g., FIG. 18) doped with dopants of a different conductivity type may not be required. Since the second well region 3n is formed in both the first region NR and the second region PR in certain embodiments, the mask patterns (e.g., photoresist patterns) used to form the first well region 3p and the second sell region 3n having different conductivity types may not be required. (See. e.g., FIGS. 4A and 4B). Thus, the overall manufacturing process may be simplified.

Figure 20:
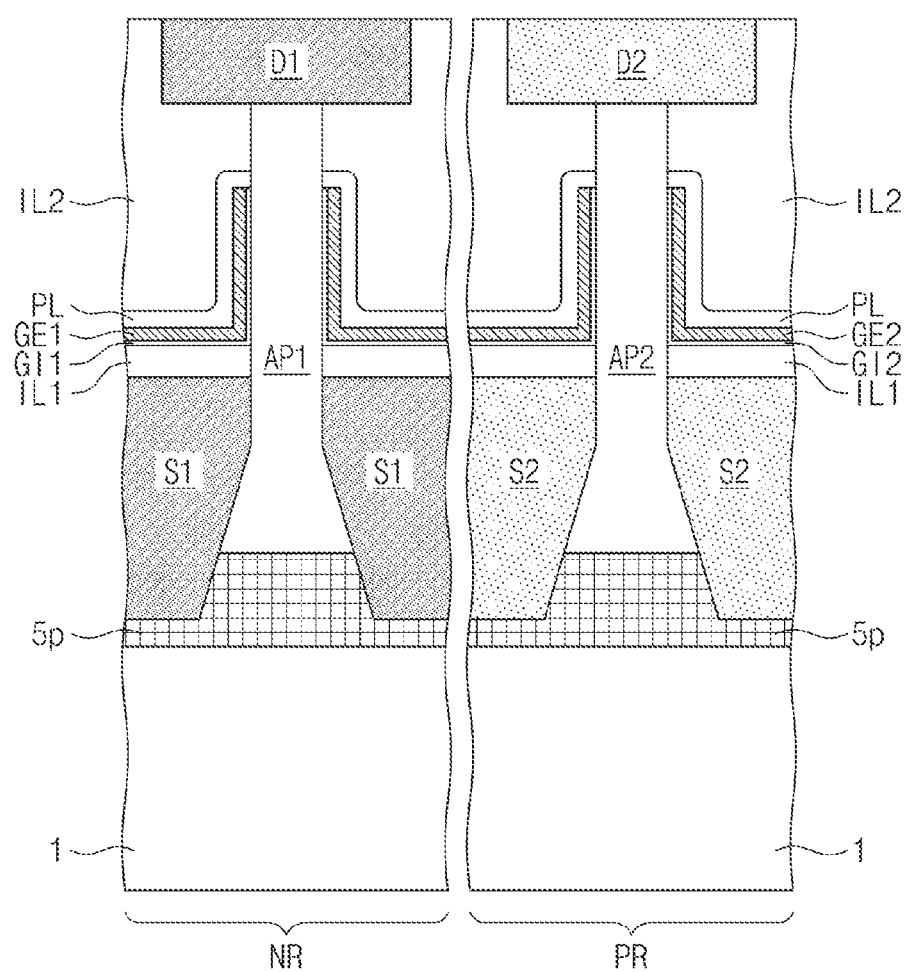
FIG. 20 is a cross-sectional view illustrating a semiconductor device according to embodiments of the inventive concept.

FIG. 20 is a cross-sectional view illustrating a semiconductor device according to embodiments of the inventive concept.

Referring to FIG. 20, vertical field effect transistors may be provided. In detail, a superlattice pattern 5p may be disposed on a substrate 1 of a first region NR. A first active pattern AP1 may be disposed on the superlattice pattern 5p. The first active pattern AP1 may have a pillar shape extending in a direction perpendicular to a top surface of the substrate 1. A sidewall of a lower portion of the first active pattern AP1 may be in contact with a first source pattern S1. The first source pattern S1 may surround the lower portion of the first active pattern AP1. A bottom surface of the first source pattern S1 may be in contact with the superlattice pattern 5p. A first interlayer insulating layer IL1 may be disposed on a top surface of the first source pattern S1. A first gate electrode GE1 may cover a sidewall of an intermediate portion of the first active pattern AP1 and a top surface of the first interlayer insulating layer IL1. The first gate electrode GE1 may have an L-shaped cross section. The first gate electrode GE1 may surround the intermediate portion of the first active pattern AP1. A first gate insulating layer GI1 may be disposed between the first gate electrode GE1 and the first active pattern AP1. The first gate insulating layer GI1 may extend between the first gate electrode GE1 and the first interlayer insulating layer ILE The first gate electrode GE1 may be covered by a protective layer PL. A second interlayer insulating layer IL2 may be disposed on the protective layer PL. A first drain pattern D1 may be disposed on a top end of the first active pattern AP1. When the first region NR is an NMOS transistor region, the first source pattern S1 and the first drain pattern D1 may be, for example, silicon patterns doped with phosphorus.

A second source pattern S2, a second active pattern AP2, a second gate electrode GE2, a second gate insulating layer GI2 and a second drain pattern D2 on the second region PR may have the same/similar shapes as the first source pattern S1, the first active pattern AP1, the first gate electrode GE1, the first gate insulating layer GI1 and the first drain pattern D1 on the first region NR. When the second region PR is a PMOS transistor region, the second source pattern S2 and the second drain pattern D2 may be, for example, silicon-germanium patterns doped with boron. Other elements and components may be the same or similar as those described in relation to FIGS. 2A and 2B.

Figure 21:
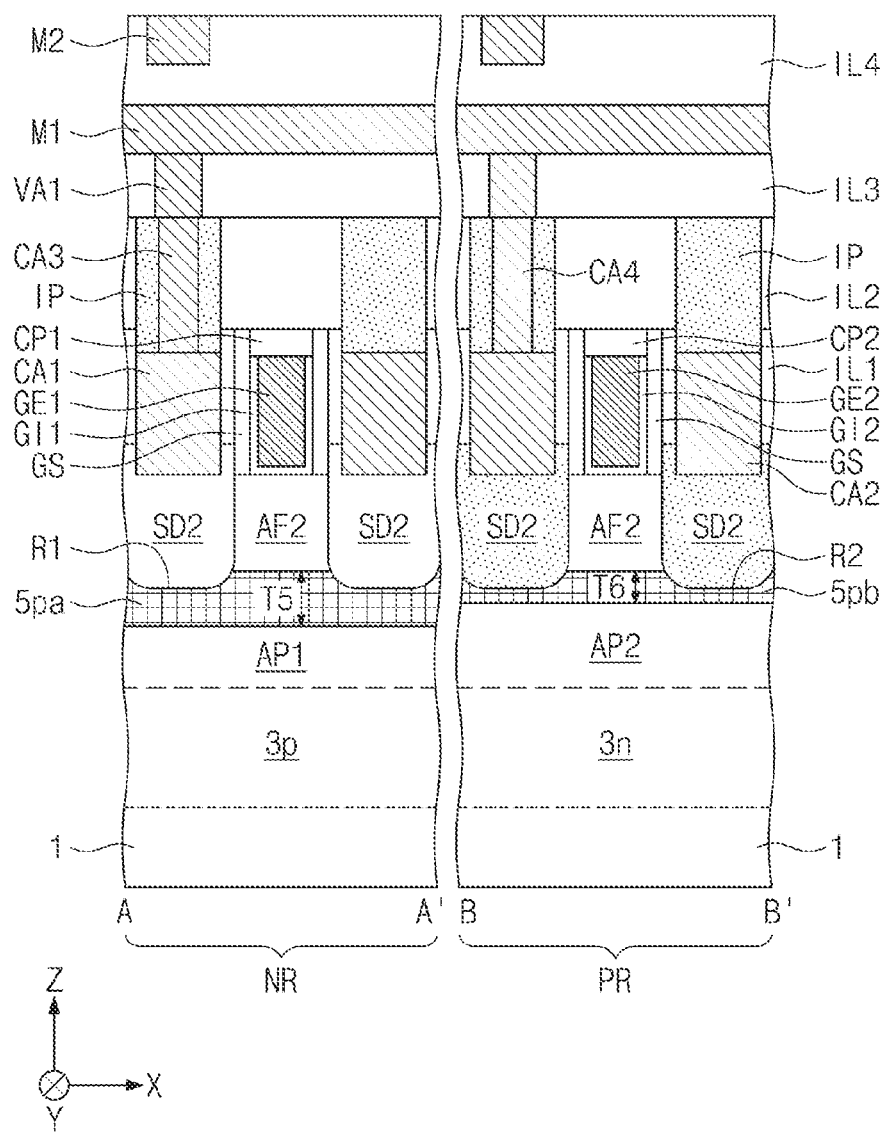

FIG. 21 is a cross-sectional view taken along the lines A-A' and B-B' of FIG. 1.

Referring to FIG. 21, a fifth thickness T5 of a first superlattice pattern 5pa disposed on the first region NR may be different from a sixth thickness T6 of a second superlattice pattern 5pb disposed on the second region PR. In some embodiments, the fifth thickness T5 may be greater than the sixth thickness T6. A top surface of the first superlattice pattern 5pa may be located at the same height as a top surface of the second superlattice pattern 5pb, and a bottom surface of the first superlattice pattern 5pa may be below a bottom surface of the second superlattice pattern 5pb. Alternatively, the bottom surfaces of the first and second superlattice patterns 5pa and 5pb may be located at the same height, and the top surfaces of the first and second superlattice patterns 5pa and 5pb may be located at different heights. Other elements and components may be the same or similar as those described in relation to FIG. 2A.

As has been described above in a variety of examples, semiconductor devices according to embodiments of the inventive concept may include a superlattice pattern configured to impede or prevent migration (e.g., diffusion) of dopants doped in source/drain pattern(s) and various well region(s). Accordingly, the reliability of the semiconductor devices may be improved.

While the inventive concept have been described with reference to example embodiments, it will be apparent to those skilled in the art that various changes and modifications may be made without departing from the spirits and scopes of the inventive concept. Therefore, it should be understood that the above embodiments are not limiting, but illustrative. Thus, the scopes of the inventive concept are to be determined by the broadest permissible interpretation of the following claims and their equivalents, and shall not be restricted or limited by the foregoing description.

What is claimed is:

1. A semiconductor device comprising:
    a first region and a second region respectively formed in a substrate;
    a first active pattern extending upward from the first region;
    a first superlattice pattern on the first active pattern;
    a first stack channel including first channel patterns that are vertically stacked on the first superlattice pattern;
    a first gate electrode on the first stack channel, the first gate electrode extending between respective first channel patterns and extending between the first superlattice pattern and a lowermost one of the first channel patterns; and
    first source/drain patterns disposed on opposing sides of the first stack channel and on the first superlattice pattern,
    wherein the first superlattice pattern includes at least one first semiconductor layer and at least one first blocker-containing layer, and
    the first blocker-containing layer includes at least one of oxygen, carbon, fluorine and nitrogen.

2. The semiconductor device of claim 1, wherein the at least one first semiconductor layer includes multiple first semiconductor layers, and the at least one first blocker-containing layer includes multiple first blocker-containing layers,
    each semiconductor layer from among the multiple first semiconductor layers is vertically and adjacently stacked with a corresponding first blocker-containing layer from among the multiple first blocker-containing layers to form a pair, and
    the first superlattice pattern includes between 1 to 10 pairs.

3. The semiconductor device of claim 2, wherein each of the first semiconductor layers among the multiple first semiconductor layers has a thickness ranging from about 1 nm to 10 nm, and each of the first blocker-containing layers among the multiple first blocker-containing layers has a thickness ranging from about 1 nm to 5 nm.

4. The semiconductor device of claim 1, wherein the first superlattice pattern contacts a bottom surface and at least a portion of a sidewall of the first source/drain patterns.

5. The semiconductor device of claim 1, wherein the first superlattice pattern contacts a bottom surface of the first source/drain patterns and is disposed between the first active pattern and the first stack channel, the first superlattice pattern has a first thickness between the first active pattern and the first stack channel and a second thickness between the first active pattern and the first source/drain patterns, and the first thickness is greater than the second thickness.

6. The semiconductor device of claim 1, further comprising:

a second active pattern extending upward from the second region;

a second superlattice pattern on the second active pattern;

a second stack channel including second channel patterns that are vertically stacked on the second superlattice pattern;

a second gate electrode disposed on the second stack channel, the second gate electrode extending between respective second channel patterns and extending between the second superlattice pattern and a lowermost one of the second channel patterns; and second source/drain patterns disposed on opposing sides of the second stack channel and on the second superlattice pattern, wherein the second superlattice pattern comprises at least one second semiconductor layer and at least one second blocker-containing layer, and the second blocker-containing layer includes at least one of oxygen, carbon, fluorine and nitrogen.

7. The semiconductor device of claim 6, wherein the first blocker-containing layer includes a different material than the second blocker-containing layer.

8. The semiconductor device of claim 6, wherein a thickness of the first superlattice pattern is different than a thickness of the second superlattice pattern.

9. The semiconductor device of claim 6, wherein an upper surface of the first superlattice pattern and an upper surface of the second superlattice pattern are at different levels.

10. The semiconductor device of claim 1, further comprising:

a second active pattern extending upward from the second region;

a second stack channel including second channel patterns that are vertically stacked on the second active pattern;

a second gate electrode disposed on the second stack channel, the second gate electrode extending between respective second channel patterns; and second source/drain patterns disposed on opposing sides of second stack channel and in contact with the second active pattern.

11. The semiconductor device of claim 10, further comprising:

a first well region disposed in the first region; and a second well region disposed in the second region, wherein the first well region and the second well region are doped with dopants having the same conductivity type.

12. A semiconductor device comprising:

a substrate;

an active pattern extending upward from the substrate;

a superlattice pattern on the active pattern;

a stack channel including a plurality of channel patterns that are vertically stacked on the superlattice pattern;

a gate electrode disposed on the stack channel; and source/drain patterns disposed on opposing sides of the stack channel and on the superlattice pattern, wherein the superlattice pattern comprises alternately stacked semiconductor layers and blocker-containing layers, the blocker-containing layers include at least one of oxygen, carbon, fluorine and nitrogen, the superlattice pattern is disposed between the active pattern and the stack channel, the superlattice pattern has a first thickness between the active pattern and the stack channel and has a second thickness between the source/drain patterns and the active pattern, and the first thickness is greater than the second thickness.

13. The semiconductor device of claim 12, wherein the gate electrode extends between respective channel patterns and between the superlattice pattern and a lowermost one of the plurality of channel patterns.

14. The semiconductor device of claim 12, wherein the gate electrode extends between respective channel patterns, and a lowermost one of the plurality of channel patterns contacts the superlattice pattern.

15. A semiconductor device comprising:

a first region and a second region respectively formed in a substrate;

a first superlattice region disposed on the first region, and a second superlattice region disposed on the second region;

a first stack channel including first channel patterns that are vertically stacked on the first superlattice region;

a second stack channel including second channel patterns that are vertically stacked on the second superlattice region;

a first gate electrode disposed on the first stack channel;

first source/drain patterns disposed on opposing sides of the first stack channel and on the first superlattice region;

a second gate electrode disposed on the second stack channel; and second source/drain patterns disposed on opposing sides of the second stack channel and on the second superlattice region, wherein each of the first and second superlattice regions includes blockers, the blockers include at least one of oxygen, carbon, fluorine and nitrogen, the first superlattice region has a first thickness under a center of a bottom surface of the first source/drain patterns and has a second thickness under an edge of the bottom surface of the first source/drain patterns, and the first thickness is different from the second thickness.

16. The semiconductor device of claim 15, wherein the first superlattice region contacts a sidewall of the first source/drain patterns, and the second superlattice region contacts a sidewall of the second source/drain patterns.

17. The semiconductor device of claim 15, wherein the blockers included in the first superlattice region are different from the blockers included in the second superlattice region.

18. The semiconductor device of claim 15, wherein the first superlattice region contacts the first source/drain patterns, and the second superlattice region is spaced apart from the second source/drain patterns.

19. The semiconductor device of claim 15, wherein an upper surface of the first superlattice region and an upper surface of the second superlattice region are at different levels.

20. The semiconductor device of claim 15, wherein a thickness of the first superlattice region is different from a thickness of the second superlattice region.

* * * * *